(12) United States Patent
Chung

(10) Patent No.: US 8,669,969 B2
(45) Date of Patent: Mar. 11, 2014

(54) SCAN DRIVER AND FLAT PANEL DISPLAY DEVICE INCLUDING THE SAME

(75) Inventor: Kyung-Hoon Chung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 749 days.

(21) Appl. No.: 12/871,820

(22) Filed: Aug. 30, 2010

(65) Prior Publication Data

US 2011/0164017 A1    Jul. 7, 2011

(30) Foreign Application Priority Data

Jan. 5, 2010  (KR) ................. 10-2010-0000568

(51) Int. Cl.
| | | |
|---|---|---|
| G06F 3/038 | (2013.01) | |
| G09G 5/00 | (2006.01) | |
| G09G 3/10 | (2006.01) | |
| G08C 19/16 | (2006.01) | |
| G09G 3/36 | (2006.01) | |
| G11C 19/00 | (2006.01) | |

(52) U.S. Cl.
USPC ..... 345/204; 345/100; 315/169.2; 340/12.21; 377/64

(58) Field of Classification Search
USPC .................. 345/204; 340/12.21; 377/64–81; 315/169.2
See application file for complete search history.

(56) References Cited

U.S. PATENT DOCUMENTS

| | | | |
|---|---|---|---|
| 2006/0152459 A1* | 7/2006 | Shin ............................ | 345/94 |
| 2007/0046608 A1* | 3/2007 | Chung ......................... | 345/92 |
| 2007/0195055 A1* | 8/2007 | Kim ............................ | 345/100 |

FOREIGN PATENT DOCUMENTS

| | | |
|---|---|---|
| KR | 1020050064930 A | 6/2005 |
| KR | 10-2006-0059082 | 6/2006 |
| KR | 10-2006-0059094 | 6/2006 |
| KR | 1020070001660 A | 1/2007 |
| KR | 1020080046380 A | 5/2008 |
| KR | 1020080062387 A | 7/2008 |

OTHER PUBLICATIONS

KIPO Notice of Allowance dated Oct. 25, 2011, for Korean Priority Patent Application No. 10-2010-0000568, listing the cited references, 5 pages.

* cited by examiner

*Primary Examiner* — Ariel Balaoing
*Assistant Examiner* — Christopher Kohlman
(74) *Attorney, Agent, or Firm* — Christie, Parker & Hale, LLP

(57) ABSTRACT

A scan driver includes a plurality of stages. Each of the plurality of stages includes an odd-numbered scan unit, an even-numbered scan unit, and a signal shift unit. The scan driver can selectively perform progressive scan and interlaced scan by varying logic levels of mode signals and clock signals applied to the stages.

21 Claims, 14 Drawing Sheets

SCAN DRIVER AND FLAT PANEL DISPLAY DEVICE INCLUDING THE SAME

CROSS-REFERENCE TO RELATED APPLICATION(S)

This application claims priority to and the benefit of Korean Patent Application No. 10-2010-0000568, filed in the Korean Intellectual Property Office on Jan. 5, 2010, the entire content of which is incorporated herein by reference.

BACKGROUND

1. Field

Aspects of embodiments according to the present invention relate to a scan driver and to a flat panel display device including the scan driver.

2. Description of Related Art

Flat panel display devices including liquid crystal display devices and organic light emitting display devices display desired images in such a manner that data signals are applied to a plurality of pixels formed in a matrix in a display area.

A scan driver applies a scan signal to pixels arranged in a selected row to coincide with data signals supplied by a data driver, in order to drive a corresponding plurality of pixels in the selected row. That is, the scan driver applies scan signals to scan lines such that desired data is supplied to pixels which receive the scan signals. Here, the scan driver supplies scan signals to a plurality of scan lines through two scanning methods: progressive scan and interlaced scan.

The progressive scan sequentially supplies scan signals to scan lines constituting a panel. That is, the scan signals are sequentially applied to the scan lines from the first scan line to the last scan line.

The interlaced scan supplies scan signals such that a single frame is displayed through two scanning operations. Specifically, the scan signals are sequentially supplied to the odd-numbered scan lines, and then sequentially applied to the even-numbered scan lines.

The progressive scan and the interlaced scan apply scan signals to scan lines in different orders. Accordingly, when a flat panel display device is manufactured, the scanning method is previously determined, and a scan driver capable of driving pixels through the determined scanning method is fabricated. To use both the two scanning methods, the flat panel display device typically must have two scan drivers.

SUMMARY

An aspect of an embodiment of the present invention is directed toward a scan driver capable of selectively performing progressive scan and interlaced scan.

According to an exemplary embodiment of the present invention, a scan driver is provided. The scan driver includes a shift register having a plurality of stages. Each of the plurality of stages includes a signal shift unit, an odd-numbered scan unit, and an even-number scan unit. The signal shift unit is coupled to a control signal line, an inverted control signal line, and either a scan start signal line or a first output terminal of a previous stage. The signal shift unit is configured to output voltages through a first output terminal and a second output terminal. The odd-numbered scan unit is coupled to the first output terminal and the second output terminal of the signal shift unit, and is configured to apply a scan signal to an odd-numbered scan line according to a plurality of mode signals and a plurality of clock signals. The even-numbered scan unit is coupled to the first output terminal and the second output terminal of the signal shift unit, and is configured to apply a scan signal to an even-numbered scan line according to the plurality of mode signals and the plurality of clock signals.

The signal shift unit may include first through ninth transistors. The first transistor is coupled between a first power supply line and a first node, and has a gate coupled to the control signal line. The second transistor is coupled between the first node and the inverted control signal line, and has a gate coupled to a second node. The third transistor is coupled between the second node and either the scan start signal line or the first output node of the previous stage, and has a gate coupled to the control signal line. The fourth transistor is coupled between the first power supply line and a third node, and has a gate coupled to the first node. The fifth transistor is coupled between the third node and a second power supply line, and has a gate coupled to the control signal line. The sixth transistor is coupled between the first power supply line and the first output terminal, and has a gate coupled to the third node. The seventh transistor is coupled between the first output terminal and the second power supply line, and has a gate coupled to the first node. The eighth transistor is coupled between the first power supply line and the second output terminal, and has a gate coupled to the first output terminal. The ninth transistor is coupled between the second output terminal and the second power supply line, and has a gate coupled to the third node.

The signal shift unit may further include a first capacitor and a second capacitor. The first capacitor is coupled between the first node and the second node. The second capacitor is coupled between the third node and the second output terminal.

The plurality of mode signals may include a first mode signal, a second mode signal, and a third mode signal. The plurality of clock signals may include a first clock signal. The odd numbered scan unit may include tenth through fourteenth transistors and a third capacitor. The tenth transistor is coupled between the first output terminal of the signal shift unit and a seventh node, and has a gate configured to receive the second mode signal. The eleventh transistor is coupled between the first power supply line and a sixth node, and has a gate configured to receive the first mode signal. The twelfth transistor is coupled between the sixth node and the seventh node, and has a gate configured to receive the third mode signal. The thirteenth transistor is coupled between a first clock signal line configured to receive the first clock signal, and an output terminal of the odd-numbered scan unit, and has a gate coupled to the seventh node. The third capacitor is coupled between the seventh node and the output terminal of the odd-numbered scan unit. The fourteenth transistor is coupled between the output terminal of the odd-numbered scan unit and the first power supply line, and has a gate coupled to the second output terminal of the signal shift unit.

The plurality of clock signals may further include a second clock signal. The even-numbered scan unit may include fifteenth through nineteenth transistors and a fourth capacitor. The fifteenth transistor is coupled between the first output terminal of the signal shift unit and a ninth node, and has a gate configured to receive the third mode signal. The sixteenth transistor is coupled between the first power supply line and an eighth node, and has a gate configured to receive the first mode signal. The seventeenth transistor is coupled between the eighth node and the ninth node, and has a gate configured to receive the second mode signal. The eighteenth transistor is coupled between a second clock signal line configured to receive the second clock signal, and an output terminal of the even-numbered scan unit, and has a gate coupled to the ninth node. The fourth capacitor is coupled between the ninth node and the output terminal of the even-numbered scan unit. The nineteenth transistor is coupled between the output terminal of the even-numbered scan unit and the first power supply line, and has a gate coupled to the second output terminal of the signal shift unit.

A voltage level of the first power supply line may be higher than a voltage level of the second power supply line.

The first through fourteenth transistors may be PMOS transistors.

The first mode signal may have a high level, and the second and third mode signals may have a low level lower than the high level during a progressive scanning operation.

The first and second mode signals may have a low level, and the third mode signal may have a high level higher than the low level during an interlaced scanning operation performed on odd-numbered scan lines.

The first and third mode signals may have a low level, and the second mode signal may have a high level higher than the low level during an interlaced scanning operation performed on even-numbered scan lines.

A voltage level of the second power supply line may be higher than a voltage level of the first power supply line.

The first through fourteenth transistors may be NMOS transistors.

The first mode signal may have a low level, and the second and third mode signals may have a high level higher than the low level during a progressive scanning operation.

The first and second mode signals may have a high level, and the third mode signal may have a low level lower than the high level during an interlaced scanning operation performed on odd-numbered scan lines.

The first and third mode signals may have a high level, and the second mode signal may have a low level lower than the high level during an interlaced scanning operation performed on even-numbered scan lines.

The plurality of clock signals may include 3-phase clock signals that are applied to the odd-numbered scan unit and the even-numbered scan unit.

A clock signal of the 3-phase clock signals applied to the odd-numbered scan unit may have a phase different from that of a clock signal of the 3-phase clock signals applied to the even-numbered scan unit.

The control signal line may include a first control signal line and a second control signal line. The inverted control signal line may include an inverted first control signal line and an inverted second control signal line. A signal shift unit included in an odd-numbered stage may be coupled to the first control signal line and the inverted first control signal line. A signal shift unit included in an even-numbered stage may be coupled to the second control signal line and the inverted second control signal line.

The control signal and the inverted control signal may have a period that is substantially four times a period of the plurality of clock signals.

The control signal and the inverted control signal may have a period that is substantially twice a period of the plurality of clock signals during an interlaced scanning operation.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
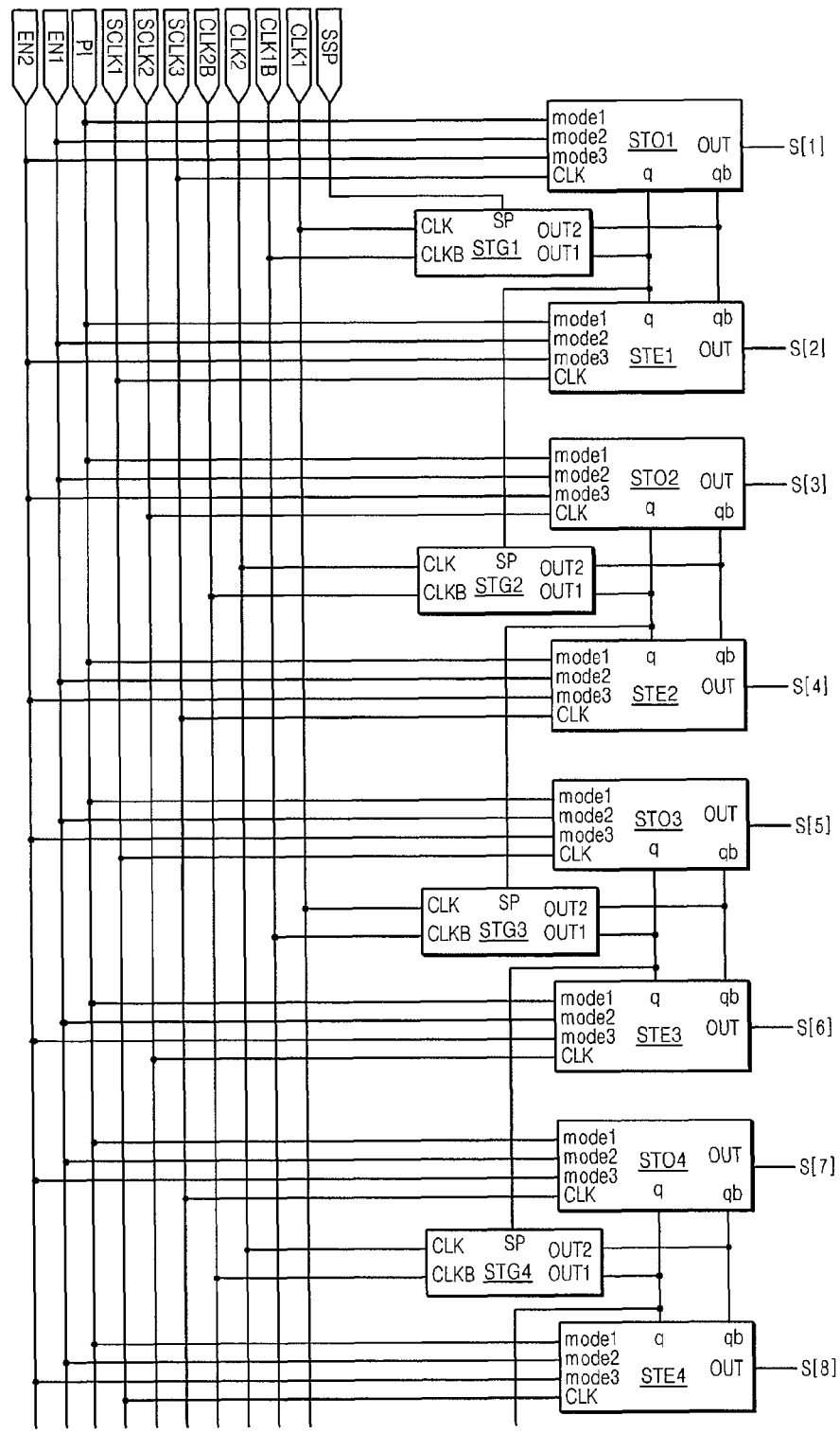
FIG. 1 is a block diagram of a scan driver for selectively performing progressive scan and interlaced scan according to an embodiment of the present invention.

Embodiments of the present invention will now be described more fully with reference to the accompanying drawings. Throughout this specification and the claims that follow, when it is described that an element is "coupled" to another element, the element may be "directly coupled" (e.g., connected) to the other element or "electrically coupled" to the other element through one or more third elements. In addition, unless explicitly described to the contrary, the word "comprise" and variations such as "comprises" or "comprising" will be understood to imply the inclusion of stated elements but not the exclusion of any other elements. Furthermore, signal lines and their corresponding signals (or power lines and their corresponding voltages) may at times be described using the same reference numeral, with the appropriate meaning apparent from context.

FIG. 1 is a block diagram of a scan driver for selectively performing progressive scan and interlaced scan according to an embodiment of the present invention.

Referring to FIG. 1, the scan driver includes a shift register having a plurality of stages coupled in series. The shift register includes a plurality of signal shift units STG1 through STGn, a plurality of odd-numbered scan units STO1 through STOn coupled to a plurality of odd-numbered scan lines S[1], S[3], ..., S[2n-1], and a plurality of even-numbered scan units STE1 through STEn coupled to a plurality of even-numbered scan lines S[2], S[4], ..., S[2n]. In addition, the shift register includes a plurality of signal lines for transferring various signals to the plurality of signal shift units STG1 through STGn, the plurality of odd-numbered scan units STO1 through STOn, and the plurality of even-numbered scan units STE1 through STEn.

The plurality of signal lines include a first control signal line for transferring a first control signal CLK1, an inverted first control signal line for transferring an inverted first control signal CLK1B, a second control signal line for transferring a second control signal CLK2, and an inverted second control signal line for transferring an inverted second control signal CLK2B. It is assumed in some embodiments of the present invention that the first control signal CLK1 and the second control signal CLK2 may be referred to as "a control signal," and that the inverted first control signal CLK1B and the inverted second control signal CLK2B may be referred to as "an inverted control signal."

The plurality of signal lines include first, second, and third clock signal lines for respectively transferring first, second, and third clock signals SCLK1, SCLK2, and SCLK3 having different phases, which are 3-phase clock signals. The first, second, and third clock signals SCLK1, SCLK2, and SCLK3 are applied to the odd-numbered scan units STO1 through STOn and the even-numbered scan units STE1 through STEn in a regular manner.

In addition, the plurality of signal lines include a first mode signal line for transferring a first mode signal PI that determines a progressive scanning operation or an interlaced scanning operation, and second and third mode signal lines for respectively transferring second and third mode signals EN1 and EN2 that determine an interlaced scanning operation. Furthermore, the plurality of signal lines includes a scan start line for transferring a scan start signal SSP for starting a scanning operation of a first stage. A single stage includes a single signal shift unit, a single odd-numbered scan unit, and a single even-numbered scan unit. For example, the first stage includes the first signal shift unit STG1, the first odd-numbered scan unit STO1, and the first even-numbered scan unit STE1.

Each of the signal shift units STG1 through STGn includes a scan start signal input terminal SP, a control signal terminal CLK, an inverted control signal terminal CLKB, a first output terminal OUT1, and a second output terminal OUT2. The scan start signal input terminal SP is coupled to the scan start line SSP or the first output terminal OUT1 of the previous stage. The control signal terminal CLK is coupled to the control signal line, and the inverted control signal terminal CLKB is coupled to the inverted control signal line. The odd-numbered signal shift units STG1, STG3, STGn-1 are coupled to the first control signal line CLK1 and the inverted first control signal line CLK1B while the even-numbered signal shift units STG2, STG4, STGn are coupled to the second control signal line CLK2 and the inverted second signal line CLK2B. The first output terminal OUT1 and the second output terminal OUT2 are coupled to the corresponding odd-numbered scan unit STO1 through STOn and even-numbered scan unit STE1 through STEn, which are paired.

Each of the signal shift units STG1 through STGn outputs signals to the corresponding odd-numbered scan unit STO1 through STOn and even-numbered scan unit STE1 through STEn, which are paired, according to the control signal, the inverted control signal, and either the scan start signal SSP transferred through the scan start line or the output signal of the signal shift unit of the previous stage.

Each of the odd-numbered scan units STO1 through STOn includes first, second, and third mode signal terminals mode1, mode2, and mode3, clock signal terminal CLK, a first input terminal q, a second input terminal qb, and an output terminal OUT.

The first input terminal q and the second input terminal qb of each odd-numbered scan unit are respectively coupled to the first output terminal OUT1 and the second output terminal OUT2 of the signal shift unit STG1 through STGn corresponding to the odd-numbered scan unit. The first, second, and third mode signal terminals mode1, mode2, and mode 3 are respectively coupled to the first, second, and third mode signal lines PI, EN1, and EN2. The output terminal OUT is coupled to the corresponding odd-numbered scan line S[1], S[3], ..., S[2n-1].

The odd-numbered scan units STO1 through STOn output scan signals to the odd-numbered scan lines S[1], S[3], ..., S[2n-1] through the output terminals OUT thereof according to the first, second, and third mode signals PI, EN1, and EN2 and the clock signal.

Each of the even-numbered scan units STE1 through STEn includes first, second, and third mode signal terminals mode1, mode2, and mode3, a clock signal terminal CLK, a first input terminal q, a second input terminal qb, and an output terminal OUT.

The first input terminal q and the second input terminal qb of each even-numbered scan unit are respectively coupled to the first output terminal OUT1 and the second output terminal OUT2 of the signal shift unit STG1 through STGn corresponding to the even-numbered scan unit. The first, second, and third mode signal terminals mode1, mode2, and mode3 are respectively coupled to the first, second, and third mode signal lines PI, EN1, and EN2. The output terminal OUT is coupled to the corresponding even-numbered scan line S[2], S[4], ..., S[2n].

The even-numbered scan units STE1 through STEn output scan signals to the even-numbered scan lines S[2], S[4], ..., S[2n] through the output terminals OUT thereof according to the first, second, and third mode signals PI, EN1, and EN2 and the clock signal.

The configuration of a single stage will now be explained in more detail.

Figure 2:
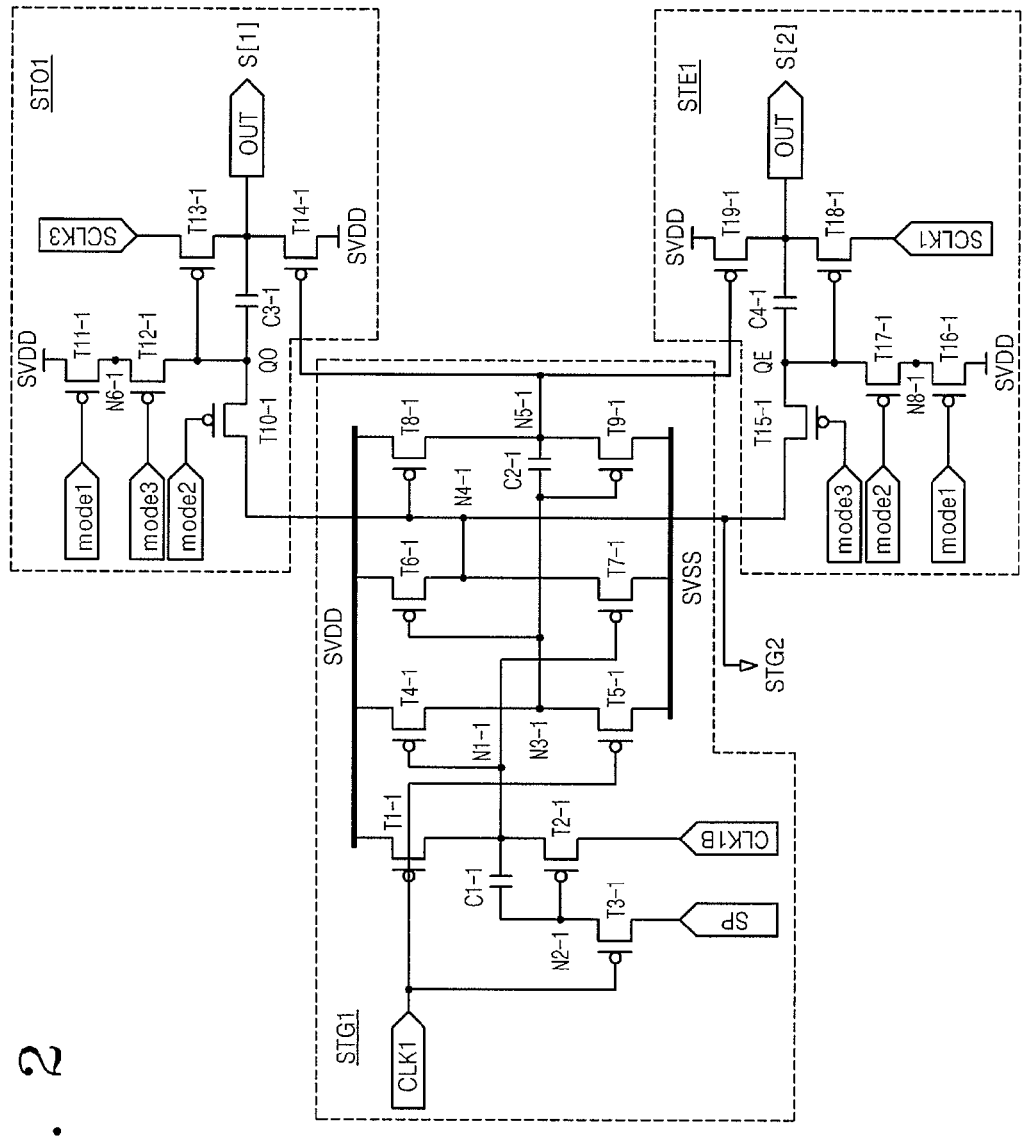
FIG. 2 is a circuit diagram of a stage included in the scan driver shown in FIG. 1 according to an embodiment of the present invention.

FIG. 2 is a circuit diagram of a stage included in the scan driver shown in FIG. 1 according to an embodiment of the present invention. The first stage is explained as an example for convenience of explanation.

Referring to FIG. 2, the first stage includes the first signal shift unit STG1, the first odd-numbered scan unit STO1, and the first even-numbered scan unit STE1.

The first signal shift unit STG1 includes first through ninth transistors T1-1 through T9-1, a first capacitor C1-1, and a second capacitor C2-1. The first transistor T1-1 is coupled between a first power supply line for supplying a first power supply voltage SVDD and a first node N1-1, and has a gate coupled to the control signal terminal CLK (for receiving first control signal CLK1).

The second transistor T2-1 is coupled between the first node N1-1 and the inverted control signal terminal CLKB (for receiving inverted first control signal CLK1B), and has a gate coupled to a second node N2-1. The third transistor T3-1 is coupled between the second node N2-1 and the scan start signal input terminal SP (for receiving scan start signal SSP), and has a gate coupled to the control signal terminal CLK (for receiving first control signal CLK1). It should be noted that in other signal shift units STG2 through STGn, the scan start signal input terminal SP is for receiving the signal from the first output terminal OUT1 of the previous stage.

The fourth transistor T4-1 is coupled between the first power supply line SVDD and a third node N3-1, and has a gate coupled to the first node N1-1. The fifth transistor T5-1 is coupled between the third node N3-1 and a second power supply line for supplying a second power supply voltage SVSS, and has a gate coupled to the control signal terminal CLK (for receiving first control signal CLK1).

The sixth transistor T6-1 is coupled between the first power supply line SVDD and a fourth node N4-1, and has a gate coupled to the third node N3-1. The seventh transistor T7-1 is coupled between the fourth node N4-1 and the second power supply line SVSS, and has a gate coupled to the first node N1-1.

The eighth transistor T8-1 is coupled between the first power supply line SVDD and a fifth node N5-1, and has a gate coupled to the fourth node N4-1. The ninth transistor T9-1 is coupled between the fifth node N5-1 and the second power supply line SVSS, and has a gate coupled to the third node N3-1.

The first capacitor C1-1 is coupled between the first node N1-1 and the second node N2-1. The second capacitor C2-1 is coupled between the third node N3-1 and the fifth node N5-1.

The fourth node N4-1 is coupled to the first output terminal OUT1, which is coupled to the first input terminals q of the first odd-numbered scan unit STO1 and the first even-numbered scan unit STE1, and to the scan start signal input terminal SP of the second signal shift unit STG2 included in the second stage. The fifth node N5-1 is coupled to the second terminal OUT2, which is coupled to the second input terminals qb of the first odd-numbered scan unit STO1 and the first even-numbered scan unit STE1.

The control signal and the inverted control signal applied to the first signal shift unit STG1 may be the first control signal CLK1 and the inverted first control signal CKL1B, respectively. The first power supply voltage may be a voltage SVDD having a high level, and the second power supply voltage may be a voltage SVSS having a low level lower than the first power supply voltage SVDD. The first through ninth transistors T1-1 through T9-1 may be PMOS transistors.

Switching operations of the first through ninth transistors T1-1 through T9-1 are controlled according to the first control signal CLK1 and the inverted first control signal CLK1B applied to the first signal shift unit STG1, and appropriate voltages are output through the first output terminal OUT1 and the second output terminal OUT2 according to the switching operations.

The first odd-numbered scan unit STO1 includes tenth through fourteenth transistors T10-1 through T14-1 and a third capacitor C3-1. The tenth transistor T10-1 is coupled between the first input terminal q and a seventh node QO, and has a gate coupled to the second mode signal terminal mode2 (for receiving second mode signal EN1).

The eleventh transistor T11-1 is coupled between the first power supply line SVDD and a sixth node N6-1, and has a gate coupled to the first mode signal terminal mode1 (for receiving first mode signal PI). The twelfth transistor T12-1 is coupled between the sixth node N6-1 and the seventh node QO, and has a gate coupled to the third mode signal terminal mode3 (for receiving third mode signal EN2).

The thirteenth transistor T13-1 is coupled between the clock signal terminal CLK (for receiving third clock signal SCLK3, for this particular embodiment and odd-numbered scan unit) and the output terminal OUT, and has a gate coupled to the seventh node QO. The fourteenth transistor T14-1 is coupled between the output terminal OUT and the first power supply line SVDD, and has a gate coupled to the second input terminal qb.

The third capacitor C3-1 is coupled between the seventh node QO and the output terminal OUT. The output terminal OUT is coupled to the first scan line S[1]. A scan signal generated by the first odd-numbered scan unit STO1 is transferred to the first scan line S[1] through the output terminal OUT.

The first input terminal q and the second input terminal qb of the first odd-numbered scan unit STO1 are respectively coupled to the first output terminal OUT1 and the second output terminal OUT2 of the first signal shift unit STG1. The clock signal applied to the first odd-numbered scan unit STO1 may be one of 3-phase clock signals having different phases. Referring to FIG. 1, the clock signal applied to the first odd-numbered scan unit STO1 corresponds to the third clock signal SCLK3 in the embodiment depicted.

The tenth through fourteenth transistors T10-1 through T14-1 may be PMOS transistors.

The first odd-numbered scan unit STO1 controls switching operations of the tenth through fourteenth transistors T10-1 through T14-1 according to the first, second, and third mode signals PI, EN1, and EN2 and the third clock signal SCLK3 applied thereto, and outputs a scan signal through the output terminal OUT according to the switching operations.

The first even-numbered scan unit STE1 includes fifteenth through nineteenth transistors T15-1 through T19-1 and a fourth capacitor C4-1. The fifteenth transistor T15-1 is coupled between the first input terminal q and a ninth node QE, and has a gate coupled to the third mode terminal mode3 (for receiving third mode signal EN2).

The sixteenth transistor T16-1 is coupled between the first power supply line SVDD and an eighth node N8-1, and has a gate coupled to the first mode signal terminal mode1 (for receiving first mode signal PI). The seventeenth transistor T17-1 is coupled between the eighth node N8-1 and the ninth node QE, and has a gate coupled to the second mode signal terminal mode2 (for receiving second mode signal EN1).

The eighteenth transistor T18-1 is coupled between the clock signal terminal CLK (for receiving first clock signal SCLK1, for this particular embodiment and even-numbered scan unit) and the output terminal OUT, and has a gate coupled to the ninth node QE. The nineteenth transistor T19-1 is coupled between the output terminal OUT and the first power supply line SVDD, and has a gate coupled to the second input terminal qb.

The fourth capacitor C4-1 is coupled between the ninth node QE and the output terminal OUT. The output terminal OUT is coupled to the second scan line S[2]. A scan signal generated by the first even-numbered scan unit STE1 is transferred to the second scan line S[2] through the output terminal OUT.

The first input terminal q and the second input terminal qb of the first even-numbered scan unit STE1 are respectively coupled to the first output terminal OUT1 and the second output terminal OUT2 of the first signal shift unit STG1. The clock signal applied to the first even-numbered scan unit STE1 may be one of the 3-phase clock signals having different phases and has a phase different from that of the clock signal applied to the odd-numbered scan unit STO1. Referring to FIG. 1, the clock signal applied to the first even-numbered scan unit STE1 corresponds to the first clock signal SCLK1 in the embodiment depicted.

The fifteenth through nineteenth transistors T15-1 through T19-1 may be PMOS transistors.

The first even-numbered scan unit STE1 controls switching operation of the fifteenth through nineteenth transistors T15-1 through T19-1 according to the first, second, and third mode signals PI, EN1, and EN2 and the first clock signal SCLK1 applied thereto, and outputs a scan signal through the output terminal OUT according to the switching operations.

The second through nth stages have substantially the same configuration as that of the aforementioned first stage. Here, clock signals are applied to the odd-numbered scan units STO1 through STOn and the even-numbered scan units STE1 through STEn in the order of the third clock signal SCLK3, the first clock signal SCLK1, and the second clock signal SCLK2.

The operation of the scan driver will now be explained.

Progressive Scanning Operation

A progressive scanning operation of the scan driver is described first.

Figure 3:
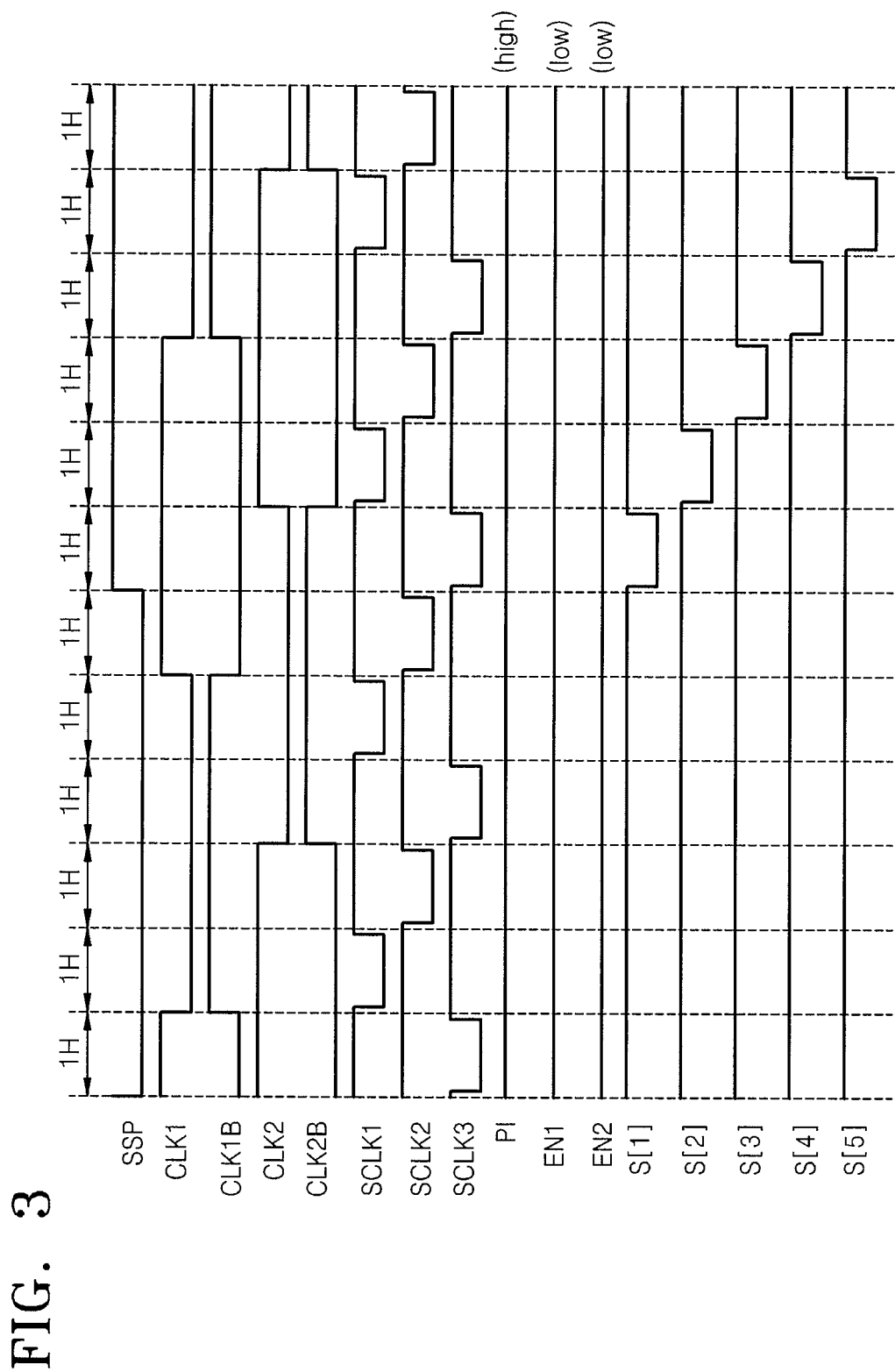
FIG. 3 is a timing diagram for illustrating a progressive scanning operation of the stage shown in FIG. 2.

FIG. 3 is a timing diagram for illustrating the progressive scanning operation of the stage shown in FIG. 2. Since the transistors constituting the stage are PMOS transistors in the current embodiment of the present invention, the transistors are turned on when a signal having a low level is applied thereto. The timing diagram of FIG. 3 is broken up into periods 1H from left to right, namely a first period, a second period, etc.

In the progressive scanning operation, the first mode signal PI has a high level that is higher than the low level, and thus the eleventh and sixteenth transistors T11-1 and T16-1 are turned off. Further, the second mode signal EN1 and the third mode signal EN2 have the low level, and thus tenth, twelfth, fifteenth, and seventeenth transistors T10-1, T12-1, T15-1, and T17-1 are turned on.

When the scan start signal SSP is applied to the scan start signal input terminal SP, the first through ninth transistors T1-1 through T9-1 are controlled by the first control signal CLK1 and the inverted first control signal CLK1B, while the fourth node N4-1 becomes the low level and the fifth node N5-1 becomes the high level, as described below.

Specifically, in the second, third, fourth, and fifth periods of FIG. 3, first, third, fifth, sixth, and ninth transistors T1-1, T3-1, T5-1, T6-1, and T9-1 are turned on and the fourth, seventh, and eighth transistors T4-1, T7-1, and T8-1 are turned off when the first control signal CLK1 and scan start signal SSP have the low level and the inverted first control signal CLK1B has the high level. At this time, the first node N1-1 becomes the high level and the second node N2-1 becomes the low level, and thus the second transistor T2-1 is turned on. Further, since the sixth transistor T6-1 is turned on, the first power supply voltage SVDD is applied to the fourth node N4-1 to make the fourth node N4-1 the high level. In addition, since the ninth transistor T9-1 is turned on, the second power supply voltage SVSS is applied to the fifth node N5-1 to make the fifth node N5-1 the low level.

When the first control signal CLK1 transitions from the low level to the high level (and the inverted first control signal CLK1B transitions from the high-level to the low level) in the sixth period, the first, third, fifth, sixth, and ninth transistors T1-1, T3-1, T5-1, T6-1, and T9-1 are turned off and the fourth, seventh, and eighth transistors T4-1, T7-1, and T8-1 are turned on. Meanwhile, the second transistor T2-1 is turned on because the voltage of the second node N2-1 is decreased according to the first capacitor C1-1 although the inverted first control signal CLK1B transitions from the high level to the low level. Since the seventh transistor T7-1 is turned on, the second power supply voltage SVSS is applied to the fourth node N4-1 to make the fourth node N4-1 the low level. In addition, the eighth transistor T8-1 is turned on, and thus the first power supply voltage SVDD is applied to the fifth node N5-1 to make the fifth node N5-1 the high level.

In the sixth period, the voltage of the fourth node N4-1 respectively charges the seventh node QO and the ninth node QE through the tenth transistor T10-1 and the fifteenth transistor T15-1. Here, the fifth node N5-1 has the high level, and thus the fourteenth transistor T14-1 and the nineteenth transistor T19-1 are turned off. Since the third clock signal SCLK3 and the first clock signal SCLK1 have the high level, output signals of the first odd-numbered scan unit STO1 and the first even-numbered scan unit STE1 have the high level. Accordingly, the high level signal is output as a scan signal during the first through sixth periods.

In the seventh period, the third clock signal SCLK3 becomes the low level, and bootstrap through parasitic capacitance of the third capacitor C3-1 and the eleventh transistor T13-1 is generated. Accordingly, the voltage of the second node QO is decreased to a level significantly lower than the second power supply voltage SVSS. As a result, the thirteenth transistor T13-1 maintains the ON state and outputs a low-level scan signal to the output terminal of the first odd-numbered scan unit STO1. While the first odd-numbered scan unit STO1 operates during the seventh period, the first even-numbered scan unit STE1 maintains the state of the first through sixth period.

In the eighth period, the third clock signal SCLK3 transitions to the high level, and thus the seventh node QO becomes the low level and the eleventh transistor T13-1 is turned on and outputs a high-level scan signal to the output terminal of the first odd-numbered scan unit STO1.

Furthermore, in the eighth period, the first clock signal SCLK1 becomes the low level, and bootstrap through parasitic capacitance of the fourth capacitor C4-1 and the eighteenth transistor T18-1 is generated. Accordingly, the voltage of the ninth node QE is decreased to a level significantly lower than the second power supply voltage SVSS. As a result, the eighteenth transistor T18-1 maintains the ON state and outputs a low-level scan signal to the output terminal of the first even-numbered scan unit STE1.

In the ninth period, the first clock signal SCLK1 transitions to the high level and the first even-numbered scan unit STE1 performs the same operation as that executed during the seventh period to output a high-level scan signal to the output terminal of the first even-numbered scan unit STE1.

Subsequently, the fifth node N5-1 of the first signal shift unit STG1 becomes the low level, and thus the fourteenth transistor T14-1 and the nineteenth transistor T19-1 are turned on. The output terminals of the first odd-numbered scan unit STO1 and the first even-numbered scan unit STE1 output high-level scan signals until the next frame. Here, the thirteenth transistor T13-1 and the eighteenth transistor T18-1 are turned off.

The voltage of the fourth node N4-1 is applied to the signal shift units of the next stage through the first output terminal OUT1. Referring to FIG. 2, the voltage of the fourth node N4-1 of the first signal shift unit STG1 is applied to the second signal shift unit STG2 included in the second stage.

As described above, the first through nth stages sequentially repeat the above-described operation and sequentially output scan signals to the first through 2nth scan lines S[1] through S[2n] to perform the progressive scanning operation.

Interlaced Scanning Operation Performed on Odd-Numbered Lines

An interlaced scanning operation of the scan driver will now be explained.

Figure 4:
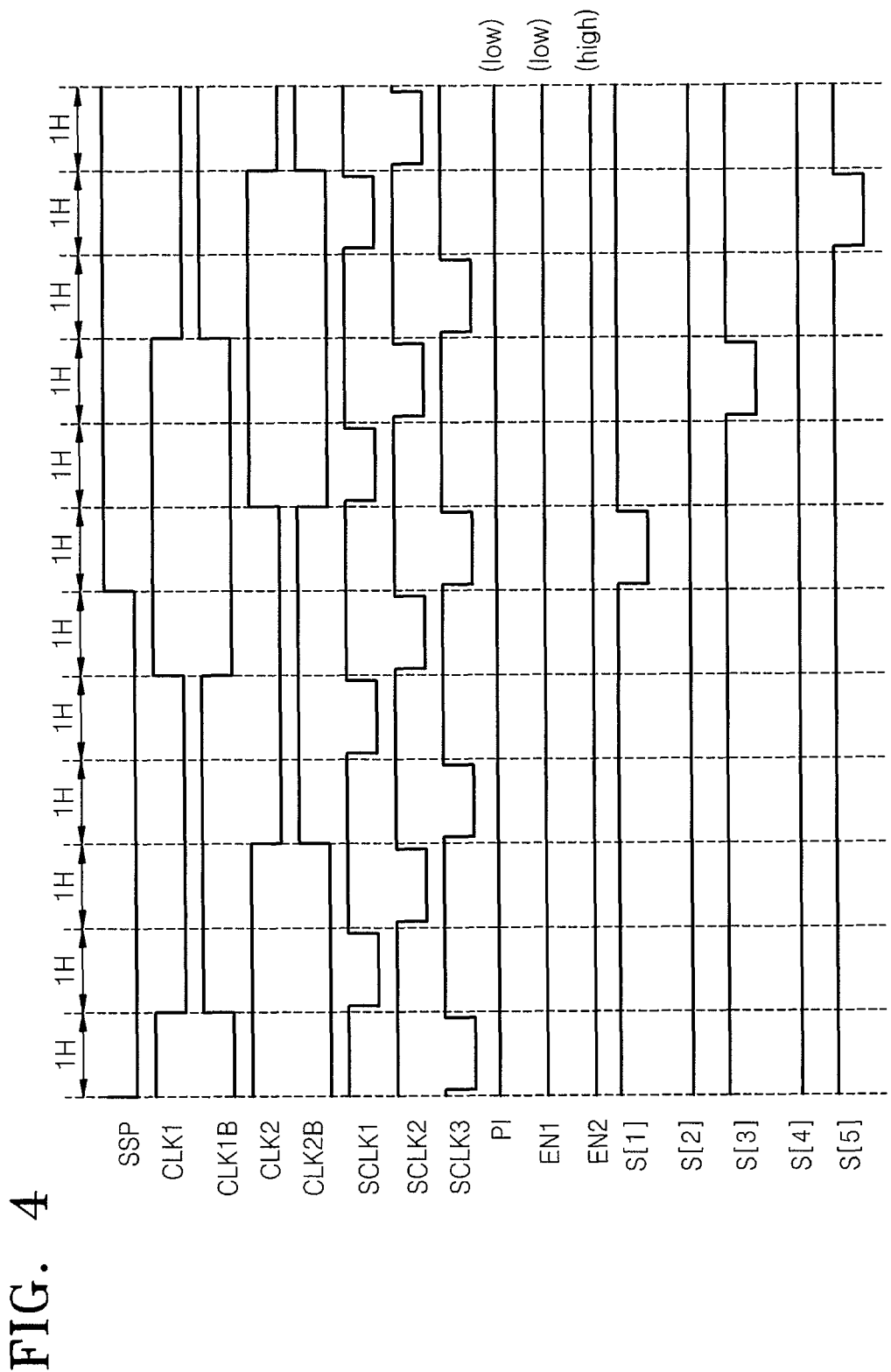
FIG. 4 is a timing diagram for illustrating an interlaced scanning operation of the stage shown in FIG. 2, which is performed on odd-numbered lines, according to an embodiment of the present invention.

FIG. 4 is a timing diagram for illustrating an interlaced scanning operation of the stage shown in FIG. 2, which is performed on odd-numbered lines.

During an interlaced scanning operation performed on odd-numbered lines, the first mode signal PI has the low level, and thus the eleventh and sixteenth transistors T11-1 and T16-1 are turned on. Further, the second mode signal EN1 has the low level, and thus the tenth and seventeenth transistors T10-1 and T17-1 are turned on. The third mode signal EN2 has the high level, and the fifteenth and twelfth transistors T15-1 and T12-1 are turned off. Since the fifteenth transistor T15-1 is turned off, the fifteenth transistor T15-1 is disconnected from the first output terminal OUT1 of the first signal shift unit STG1. Accordingly, all of the even-numbered scan units STE1 through STEn output high-level scan signals through the output terminals thereof during the interlaced scanning operation.

Based on the aforementioned mode signals, the first odd-numbered scan unit STO1 operates in the same manner as the progressive scanning operation according to the third clock signal SCLK3. In addition, the other odd-numbered scan units STO2 through STOn also operate in the same manner as the progressive scanning operation.

Based on the aforementioned mode signals, the ninth node QE of the first even-numbered scan unit STE1 maintains the first power supply voltage SVDD, and thus a high-level scan signal is continuously output to the second scan line S[2] coupled to the output terminal of the first even-numbered scan unit STE1. Here, the ninth node QE is not floated and maintains the first power supply voltage SVDD through the sixteenth and seventeenth transistors T16-1 and T17-1 to prevent or protect the second scan line S[2] from abnormally operating according to the first clock signal SCLK1 through eighteenth transistor T18-1.

The interlaced scanning operation can be performed on the odd-numbered lines in such a manner that the odd-numbered scan units STO1 through STOn sequentially operate and the even-numbered scan units STE1 through STEn continuously output high-level scan signals as described above.

Interlaced Scanning Operation Performed on Even-Numbered Lines

Figure 5:
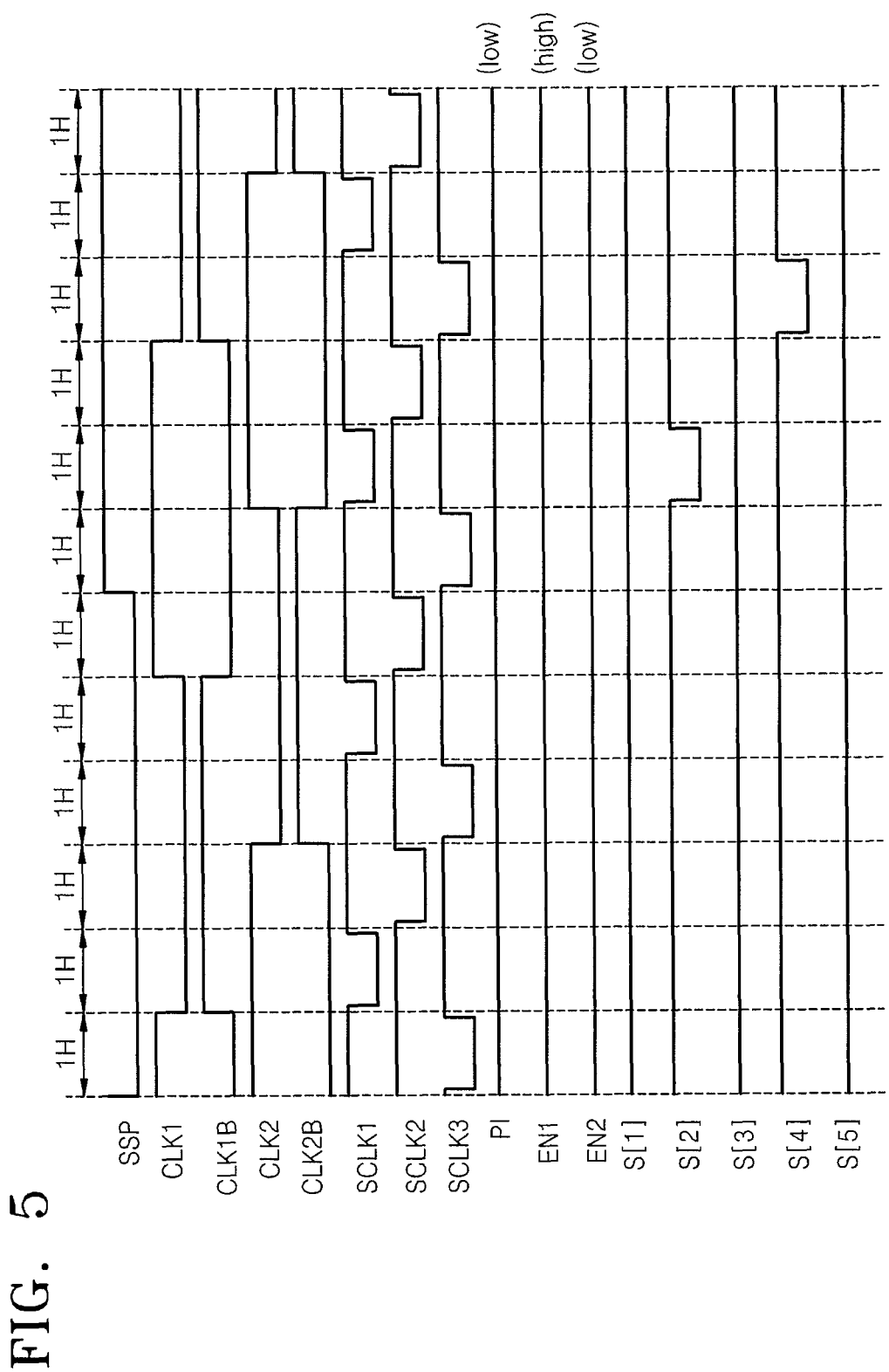
FIG. 5 is a timing diagram for illustrating an interlaced scanning operation of the stage shown in FIG. 2, which is performed on even-numbered lines, according to an embodiment of the present invention.

FIG. 5 is a timing diagram for illustrating an interlaced scanning operation of the stage shown in FIG. 2, which is performed on even-numbered lines.

During an interlaced scanning operation performed on even-numbered lines, the first mode signal PI has the low level, and thus the eleventh and sixteenth transistors T11-1 and T16-1 are turned on. Further, the second mode signal EN1 has the high level, and thus the tenth and seventeenth transistors T10-1 and T17-1 are turned off. The third mode signal EN2 has the low level, and thus fifteenth and twelfth transistors T15-1 and T12-1 are turned on. Since the tenth transistor T10-1 is turned off, the tenth transistor T10-1 is disconnected from the first output terminal OUT1 of the first signal shift unit STG1. Accordingly, all of the odd-numbered scan units STO1 through STOn output high-level scan signals through the output terminals thereof during the interlaced scanning operation.

Based on the aforementioned mode signals, the first even-numbered scan unit STE1 operates in the same manner as the progressive scanning operation according to the first clock signal SCLK1. In addition, the other even-numbered scan units STE2 through STEn also operate in the same manner as the progressive scanning operation.

Based on the aforementioned mode signals, the seventh node QO of the first odd-numbered scan unit STO1 maintains the first power supply voltage SVDD, and thus a high-level scan signal is continuously output to the first scan line S[1] coupled to the output terminal of the first odd-numbered scan unit STO1. Here, the seventh node QO is not floated and maintains the first power supply voltage SVDD through the eleventh and twelfth transistors T11-1 and T12-1 to prevent or protect the first scan line S[1] from abnormally operating according to the third clock signal SCLK3 through thirteenth transistor T13-1.

The interlaced scanning operation can be performed on the even-numbered lines in such a manner that the even-numbered scan units STE1 through STEn sequentially operate and the odd-numbered scan units STO1 through STOn continuously output high-level scan signals as described above.

The scan driver can perform both the progressive scanning operation and the interlaced scanning operation by varying the logic levels of the first, second, and third mode signals PI, EN1, and EN2.

An interlaced scanning operation according to another embodiment of the present invention will now be explained.

According to the timing diagrams of FIGS. 4 and 5, the width of scan signals applied to scan lines during an interlaced scanning operation corresponds to the width of scan signals applied to the scan lines during a progressive scanning operation. In FIGS. 4 and 5, the width of the scan signals is substantially identical to the width of clock signals and corresponds to a quarter of the width of control signals. In this case, however, an idle period is generated between scan signals applied to scan lines. An interlaced scanning operation without the idle period will now be explained in the following embodiment of the present invention.

Figure 6:
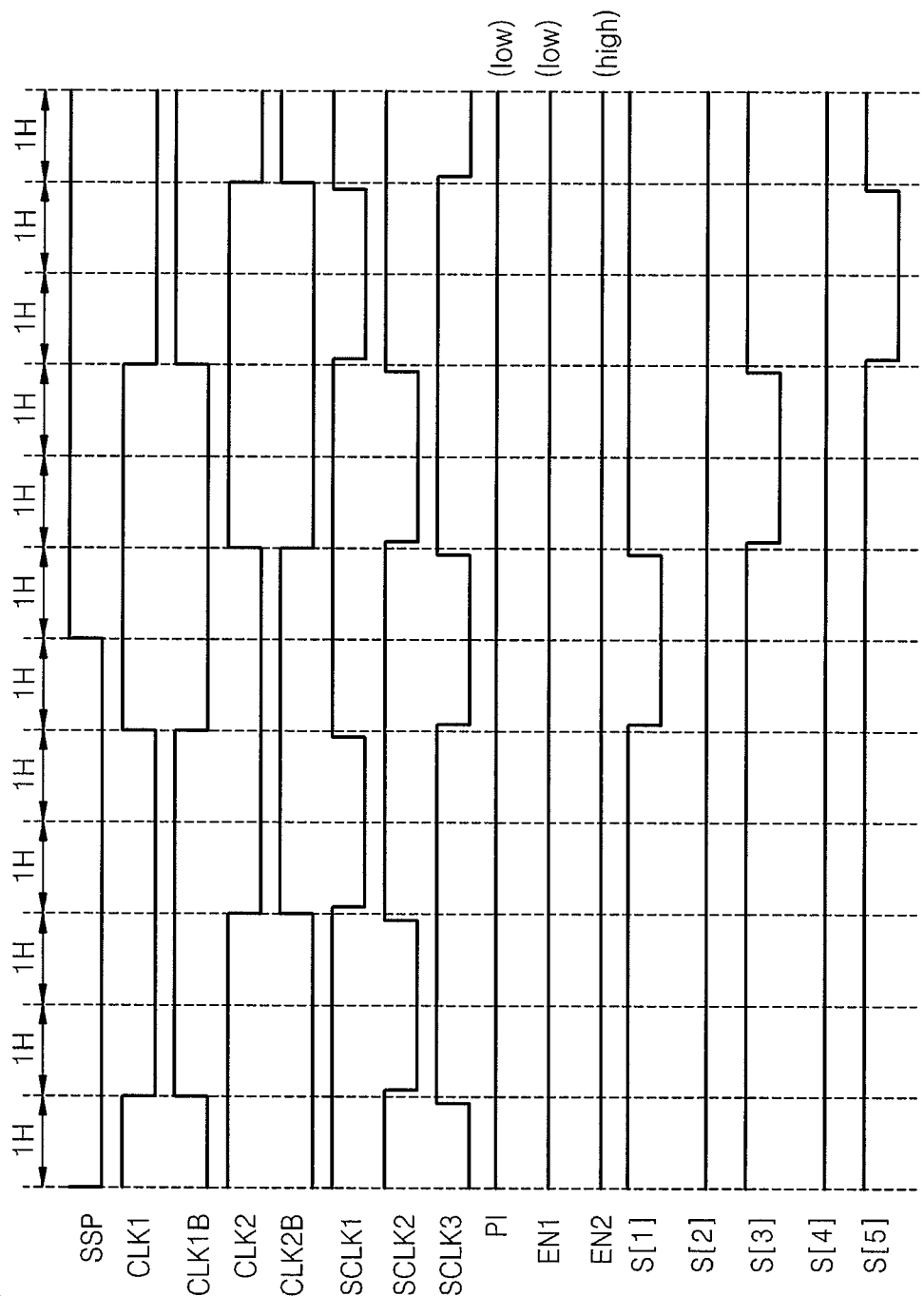
FIG. 6 is a timing diagram for illustrating an interlaced scanning operation of the stage shown in FIG. 2, which is performed on odd-numbered lines, according to another embodiment of the present invention.

Interlaced Scanning Operation Performed on Odd-Numbered Lines According to Another Embodiment FIG. 6 is a timing diagram for illustrating an interlaced scanning operation of the stage shown in FIG. 2, which is performed on odd-numbered lines, according to another embodiment of the present invention.

Referring to FIG. 6, the first control signal CLK1, the inverted first control signal CLK1B, the second control signal CLK2, the inverted second control signal CLK2B, and the plurality of mode signals PI, EN1, and EN2 are identical (or substantially identical) to those shown in FIG. 4.

The width of the clock signals SCLK1, SCLK2, and SCLK3 becomes twice the width of the clock signals SCLK1, SCLK2, and SCLK3 shown in FIG. 4 and corresponds to half the width of the control signals. Accordingly, the width of the generated odd-numbered scan signals S[1] through S[2n-1] corresponds to the width of the clock signals SCLK1, SCLK2, and SCLK3.

Referring back to FIG. 1, clock signals affecting the odd-numbered scan units STO1 through STOn are repeated in the order of the third clock signal SCLK3, the second clock signal SCLK2, and the first clock signal SCLK1. Accordingly, the clock signals are input in the order of the third clock signal SCLK3, the second clock signal SCLK2, and the first clock signal SCLK1.

Figure 7:
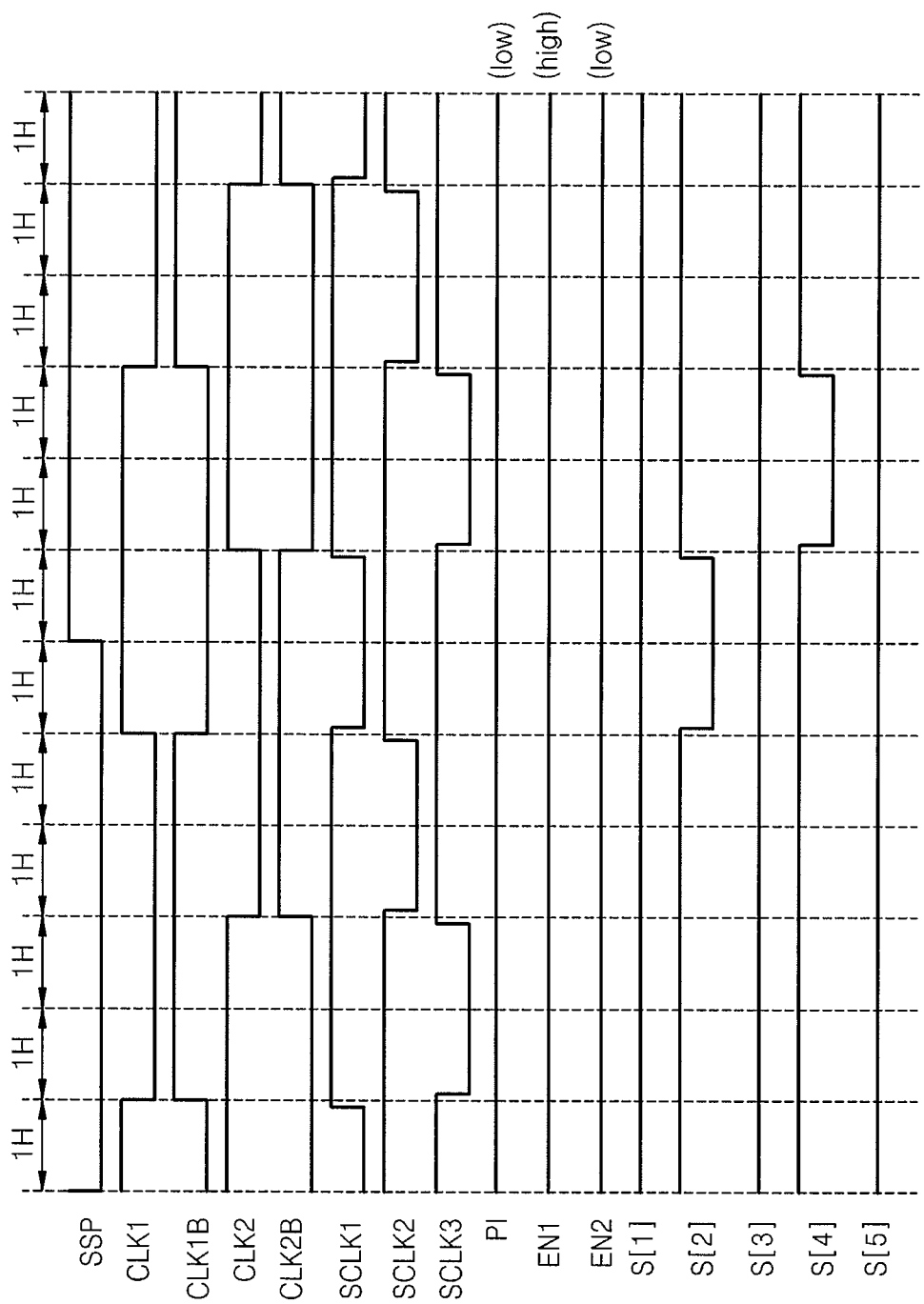
FIG. 7 is a timing diagram for illustrating an interlaced scanning operation of the stage shown in FIG. 2, which is performed on even-numbered lines, according to another embodiment of the present invention.

Interlaced Scanning Operation Performed on Even-Numbered Lines According to Another Embodiment FIG. 7 is a timing diagram for illustrating an interlaced scanning operation of the stage shown in FIG. 2, which is performed on even-numbered lines, according to another embodiment of the present invention.

Referring to FIG. 7, the first control signal CLK1, the inverted first control signal CLK1B, the second control signal CLK2, the inverted second control signal CLK2B, and the plurality of mode signals PI, EN1, and EN2 are identical (or substantially identical) to those shown in FIG. 5.

The width of the clock signals SCLK1, SCLK2, and SCLK3 becomes twice the width of the clock signals SCLK1, SCLK2, and SCLK3 shown in FIG. 5 and corresponds to half the width of the control signals. Accordingly, the width of the generated even-numbered scan signals S[2] through S[2n] corresponds to the width of the clock signals SCLK1, SCLK2, and SCLK3.

Referring back to FIG. 1, clock signals affecting the even-numbered scan units STE1 through STEn are repeated in the order of the first clock signal SCLK1, the third clock signal SCLK3, and the second clock signal SCLK2. Accordingly, the clock signals are input in the order of the first clock signal SCLK1, the third clock signal SCLK3, and the second clock signal SCLK2.

As described above, scan signals can be sequentially applied to scan lines without having an idle period by varying the order and width of the first, second, and third clock signals SCLK1, SCLK2, and SCLK3.

Figure 8:
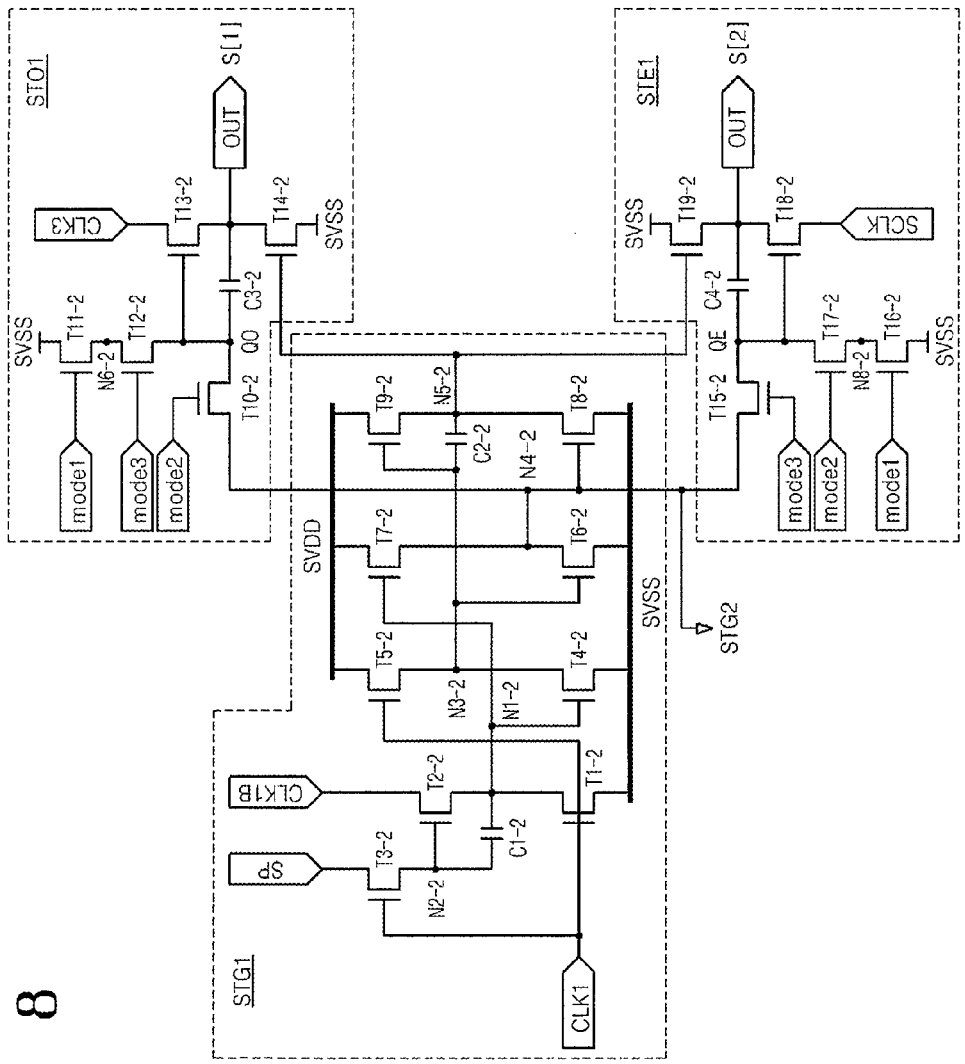
FIG. 8 is a circuit diagram of the stage included in the scan driver shown in FIG. 1 according to another embodiment of the present invention.

FIG. 8 is a circuit diagram of the stage included in the scan driver shown in FIG. 1 according to another embodiment of the present invention.

Referring to FIG. 8, the signal shift unit STG1, odd-numbered scan unit STO1, and even-numbered scan unit STE1 have the same circuit configurations as those shown in FIG. 2. However, transistors included in the signal shift unit STG1, odd-numbered scan unit STO1, and even-numbered scan unit STE1 are NMOS transistors. In addition, the first power supply line supplies voltage value SVSS and the second power supply line supplies voltage value SVDD higher than voltage value SVSS.

Progressive Scanning Operation with Another Exemplary Scan Driver

Figure 9:
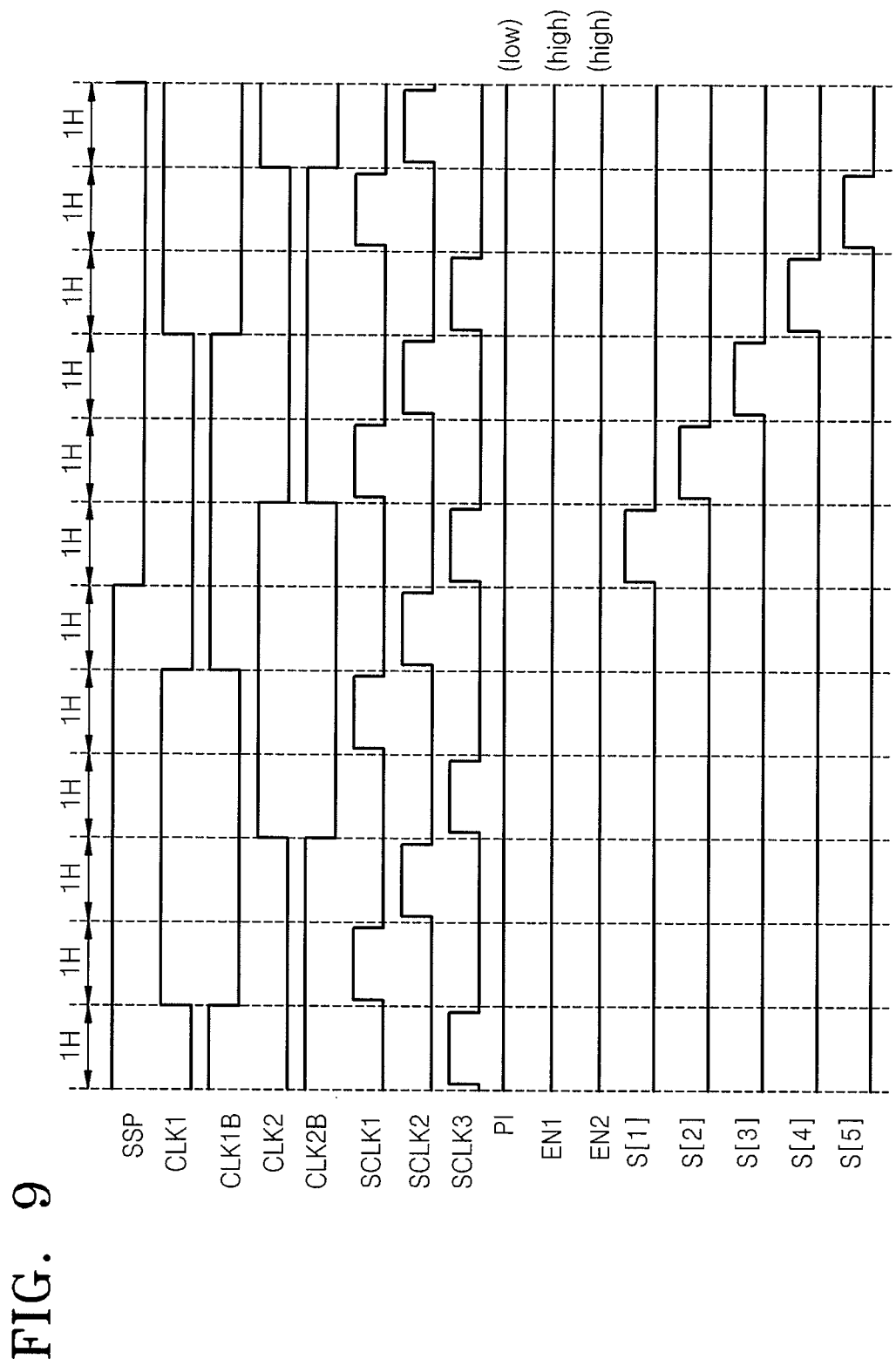
FIG. 9 is a timing diagram for illustrating a progressive scanning operation of the stage shown in FIG. 8.

FIG. 9 is a timing diagram for illustrating a progressive scanning operation of the stage shown in FIG. 8.

Referring to FIG. 9, the timings of applying signals corresponds to the timings shown in FIG. 3. However, the signals have logic levels opposite to those of the signals shown in FIG. 3 since the stage according to the embodiment of FIG. 9 uses NMOS transistors. The first mode signal PI has the low level, and the second and third mode signals EN1 and EN2 have the high level.

As described above, the stage shown in FIG. 8 can perform a progressive scanning operation according to the signals having logic levels opposite to those of the signals shown in FIG. 3.

Interlaced Scanning Operation with Another Exemplary Scan Driver

Figure 10:
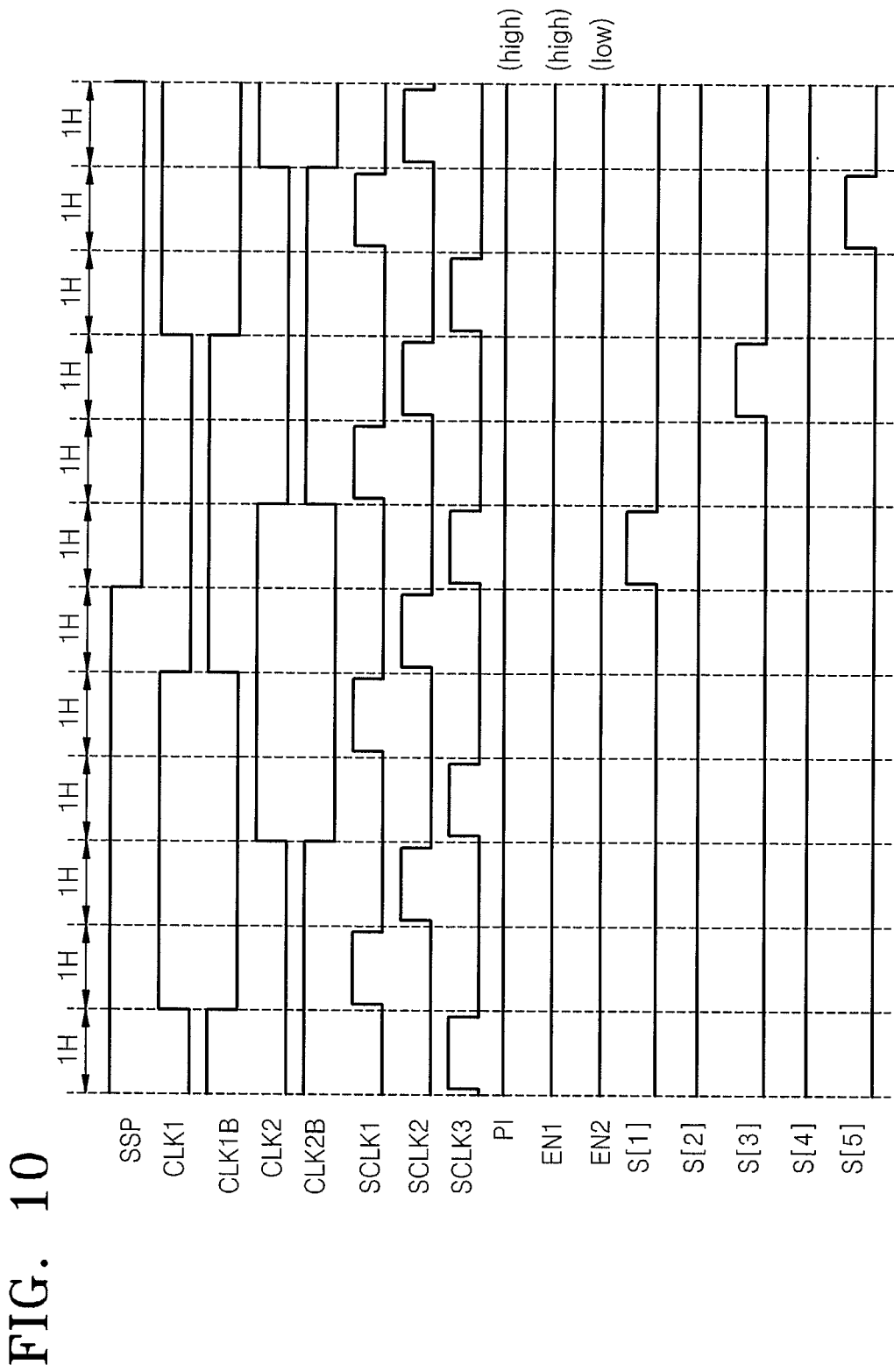
FIG. 10 is a timing diagram for illustrating an interlaced scanning operation of the stage shown in FIG. 8, which is performed on odd-numbered lines, according to an embodiment of the present invention.
Figure 11:
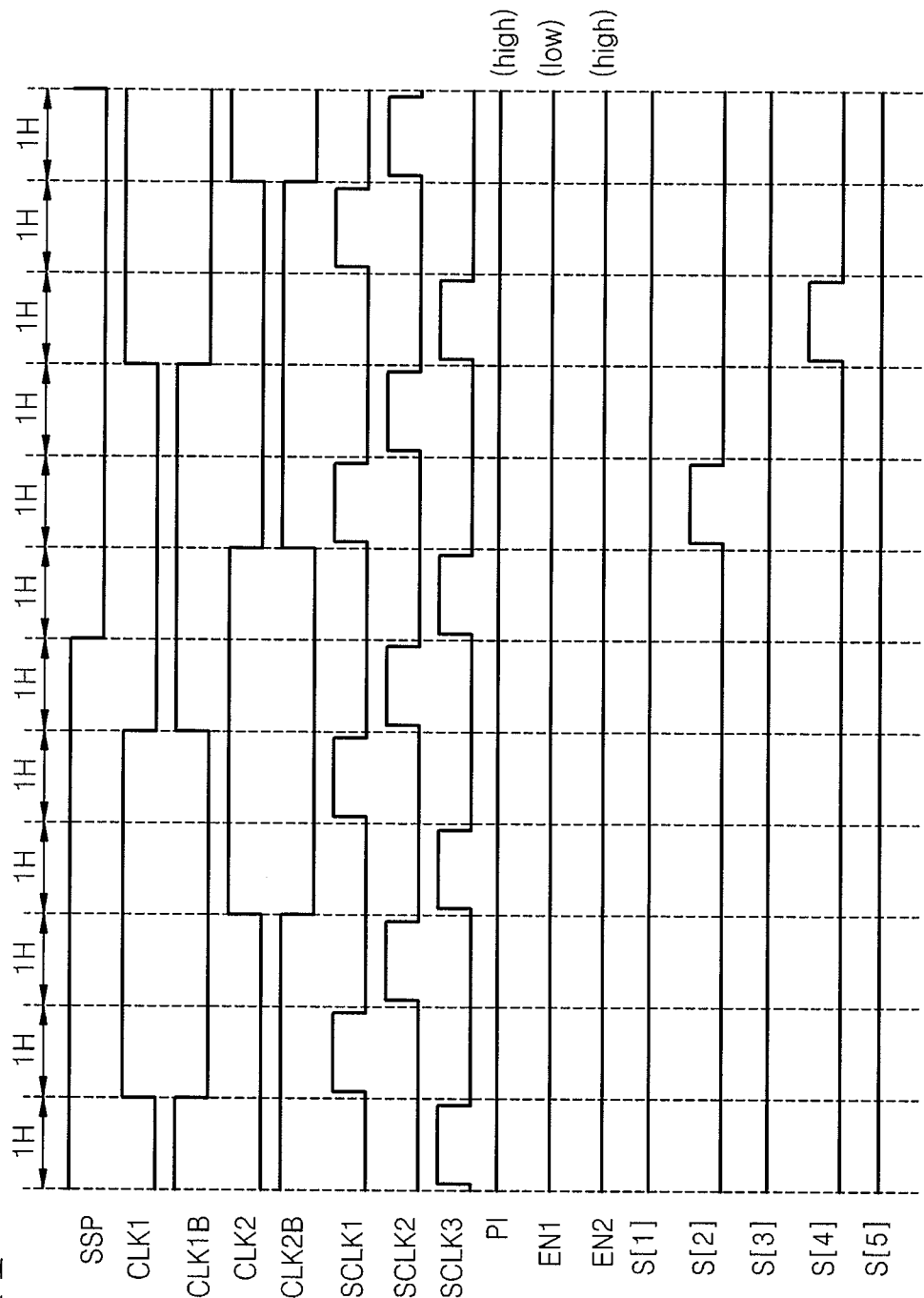
FIG. 11 is a timing diagram for illustrating an interlaced scanning operation of the stage shown in FIG. 8, which is performed on even-numbered lines, according to an embodiment of the present invention.

FIGS. 10 and 11 are timing diagrams for illustrating an interlaced scanning operation of the stage shown in FIG. 8.

FIG. 10 is a timing diagram for illustrating an interlaced scanning operation of the stage shown in FIG. 8, which is performed on odd-numbered lines. Referring to FIG. 10, the timings of applying various signals correspond to the timings shown in FIG. 4. However, the signals have logic levels opposite to those of the signals shown in FIG. 4 since the stage according to the embodiment of FIG. 10 uses NMOS transistors. The first mode signal PI and the second mode signal EN1 have the high level, and the third mode signal EN2 has the low level.

FIG. 11 is a timing diagram for illustrating an interlaced scanning operation of the stage shown in FIG. 8, which is performed on even-numbered lines. Referring to FIG. 11, the timings of applying various signals correspond to the timings shown in FIG. 5. However, the signals have logic levels opposite to those of the signals shown in FIG. 5 since the stage according to the embodiment of FIG. 11 uses NMOS transistors. The first mode signal PI and the third mode signal EN2 have the high level, and the second mode signal EN1 has the low level.

As described above, the stage shown in FIG. 8 can perform an interlaced scanning operation according to the signals having logic levels opposite to those of the signals shown in FIGS. 4 and 5.

Figure 12:
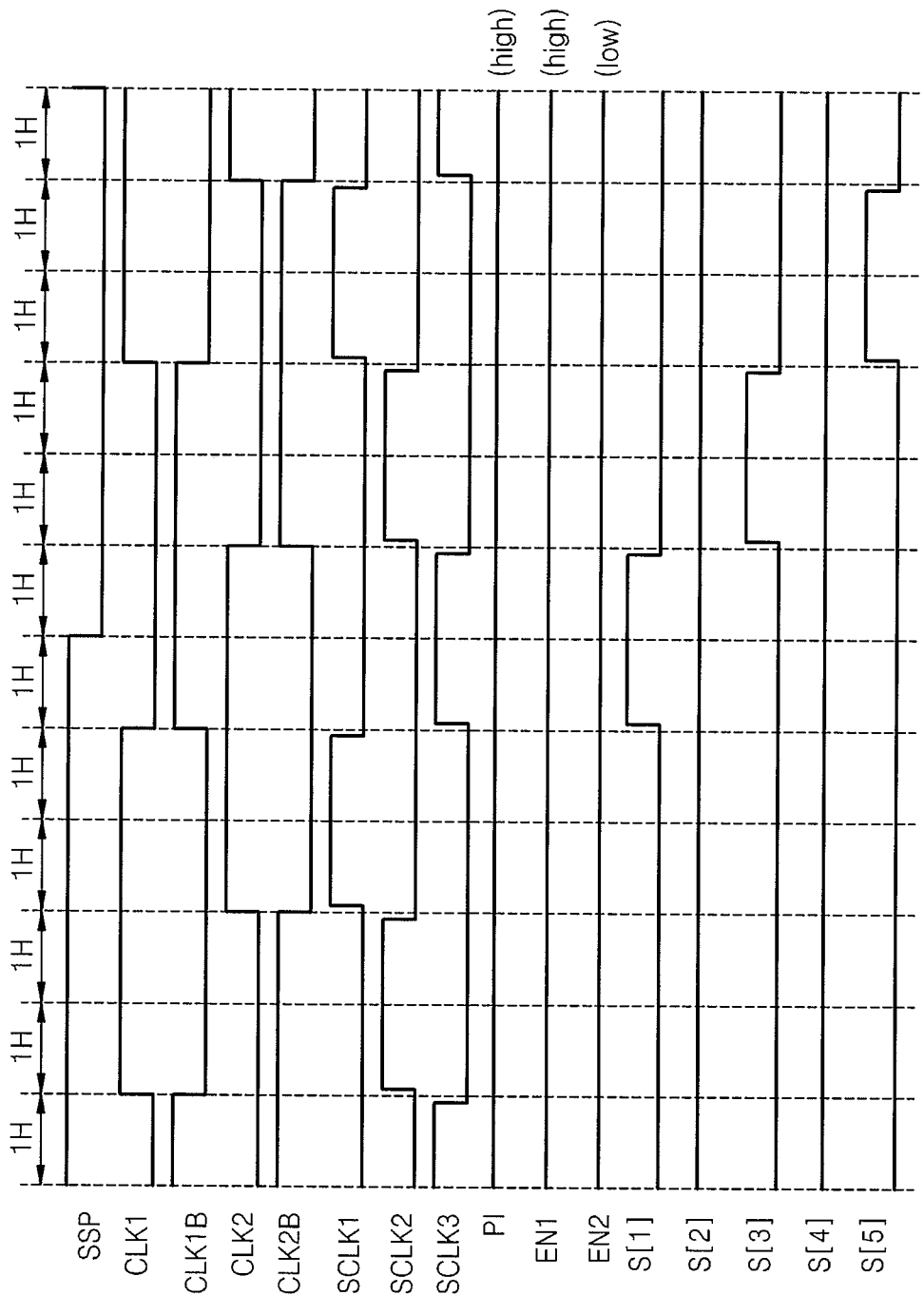
FIG. 12 is a timing diagram for illustrating an interlaced scanning operation of the stage shown in FIG. 8, which is performed on odd-numbered lines, according to another embodiment of the present invention.
Figure 13:
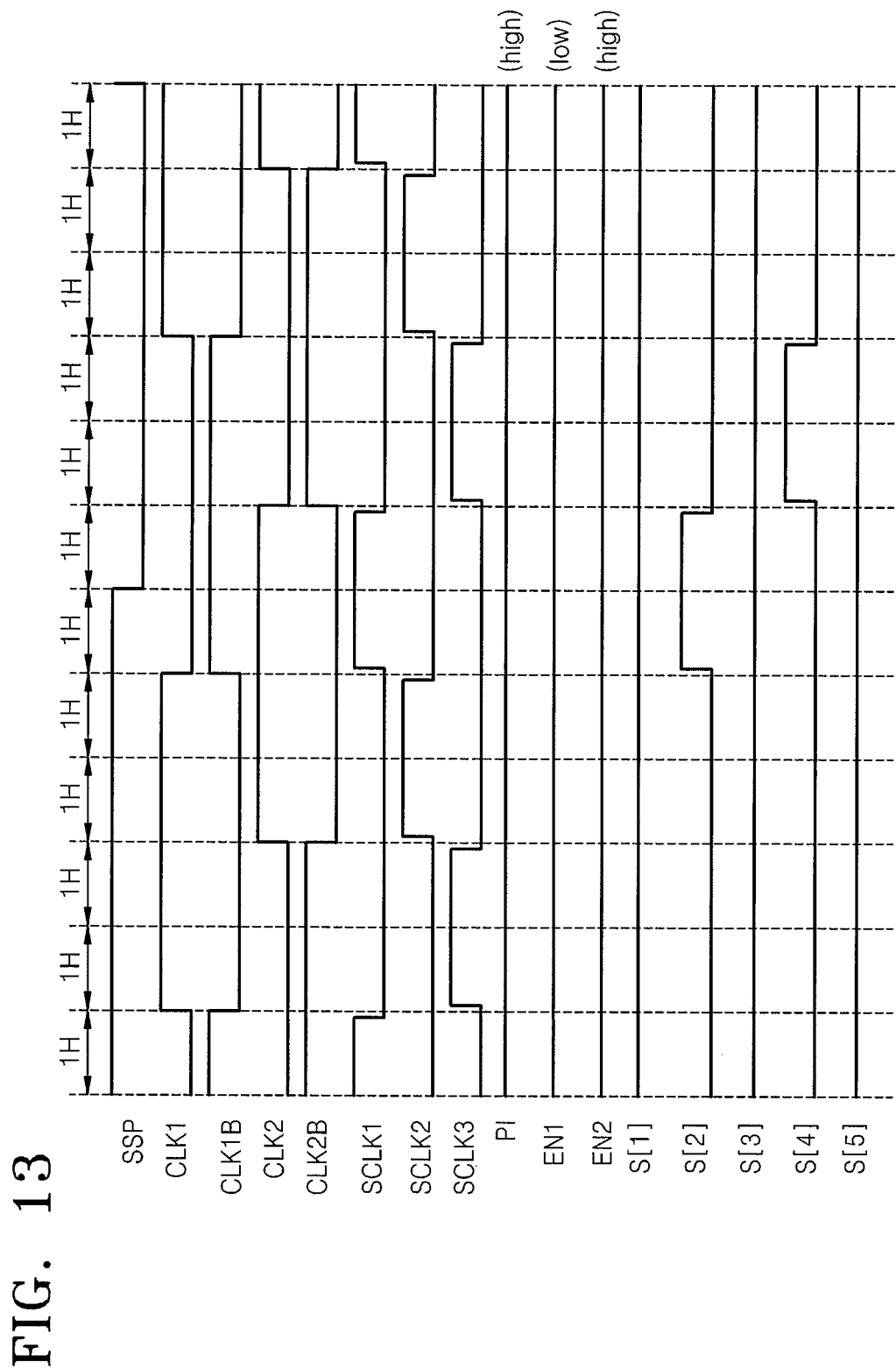
FIG. 13 is a timing diagram for illustrating an interlaced scanning operation of the stage shown in FIG. 8, which is performed on even-numbered lines, according to another embodiment of the present invention.

Interlaced Scanning Operation with another Exemplary Scan Driver According to Another Embodiment FIGS. 12 and 13 are timing diagrams for illustrating an interlaced scanning operation of the stage shown in FIG. 8 according to another embodiment of the present invention.

FIG. 12 is a timing diagram for illustrating an interlaced scanning operation of the stage shown in FIG. 8, which is performed on odd-numbered lines, according to another embodiment of the present invention. Referring to FIG. 12, the timings of applying various signals correspond to the timings shown in FIG. 6. However, the signals have logic levels opposite to those of the signals shown in FIG. 6 since the stage according to the embodiment of FIG. 12 uses NMOS transistors. The first mode signal PI and the second mode signal EN1 have the high level, and the third mode signal EN2 has the low level.

FIG. 13 is a timing diagram for illustrating an interlaced scanning operation of the stage shown in FIG. 8, which is performed on even-numbered lines, according to another embodiment of the present invention. Referring to FIG. 13, the timings of applying various signals correspond to the timings shown in FIG. 7. However, the signals have logic levels opposite to those of the signals shown in FIG. 7 since the stage according to the embodiment of FIG. 13 uses NMOS transistors. The first mode signal PI and the third mode signal EN2 have the high level, and the second mode signal EN1 has the low level.

As described above, the stage shown in FIG. 8 can perform an interlaced scanning operation according to the signals having logic levels opposite to those of the signals shown in FIGS. 6 and 7. In the current embodiment of the present invention, an idle period is not generated between scan signals applied to scan lines.

The operation of the stage shown in FIG. 8 is identical (or substantially identical) to the operation of the stage shown in FIG. 2 so that explanation of the detailed operation of the stage according to the timing diagrams of FIGS. 9 through 13 is not provided again.

Figure 14:
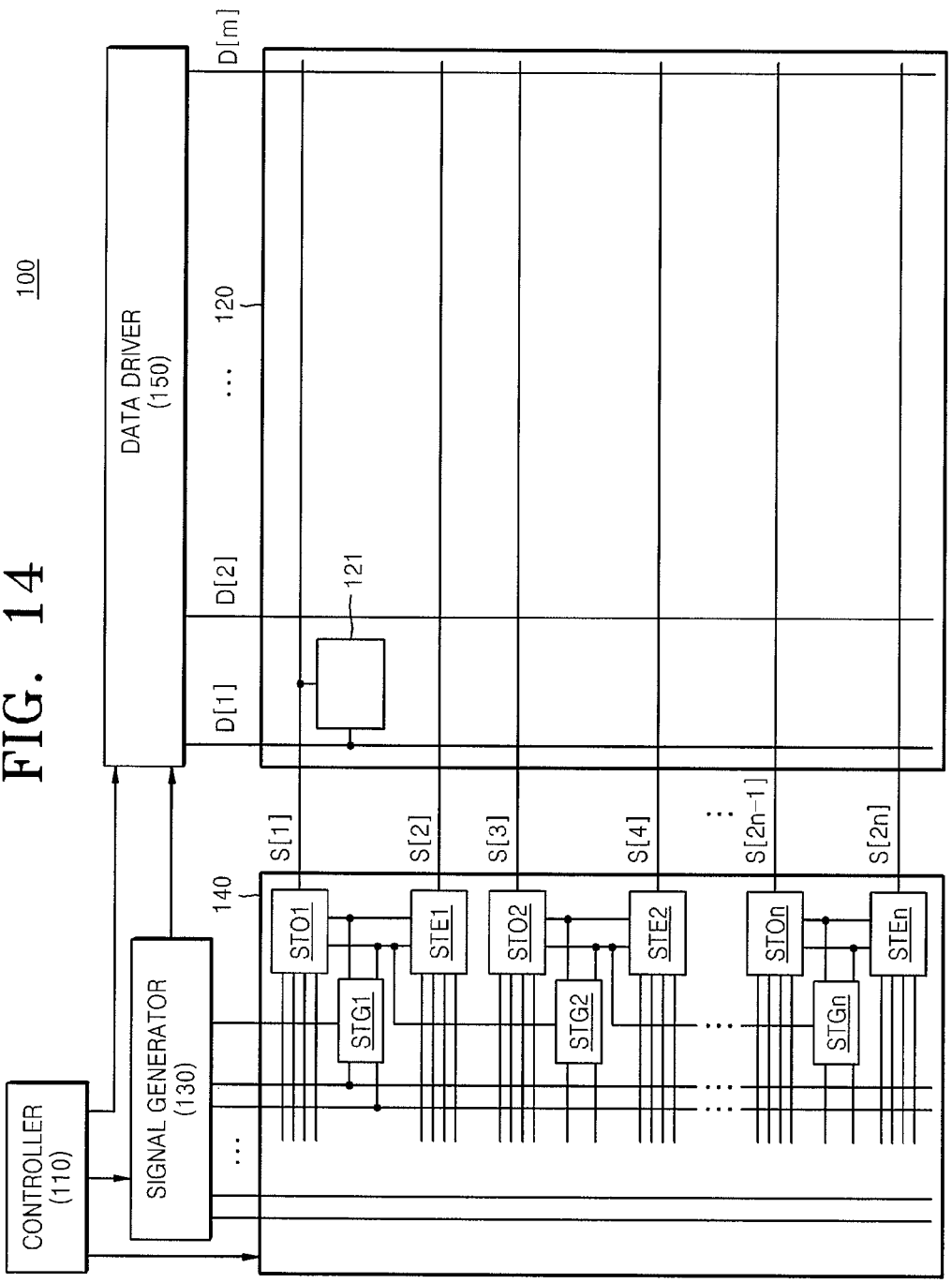
FIG. 14 is a block diagram of a flat panel display device including the scan driver selectively performing progressive scan and interlaced scan according to the embodiments of the present invention.

FIG. 14 is a block diagram of a flat panel display device 100 including a scan driver capable of selectively performing progressive scan and interlaced scan according to embodiments of the present invention.

Referring to FIG. 14, the flat panel display device 100 includes a controller 110, a display region 120, a signal generator 130, a scan driver 140, and a data driver 150.

The controller 110 controls operations of components of the flat panel display device 100. The controller 110 determines whether the flat panel display device 100 operates in a progressive scanning mode or an interlaced scanning mode, and controls the operations of the components of the flat panel display device 100 according to that determination.

The display region 120 includes 2n×m pixel circuits 121 arranged in a matrix, 2n scan lines S[1], S[2], . . . , S[2n] arranged in a row direction, and m data lines D[1], D[2], . . . , D[m] arranged in a column direction. In addition, the display region 120 may include power lines (not shown)

for applying power to the plurality of pixel circuits 121. The pixel circuits 121 are respectively formed at crossing regions (intersections) of the scan lines S[1], S[2], ..., S[2n] and the data lines D[1], D[2], ..., D[m].

The pixel circuits 121 may be circuits for an organic light emitting display device including OLEDs (Organic Light Emitting Diodes). However, the pixel circuits 121 are not limited thereto and may, for example, be circuits for an LCD (Liquid Crystal Display).

The scan lines S[1], S[2], ..., S[2n] transfer scan signals to the pixel circuits 121, and the data lines D[1], D[2], ..., D[m] transfer data signals to the pixel circuits 121.

The signal generator 130 generates various control signals for operating the scan driver 140 in the progressive scanning mode or interlaced scanning mode under the control of the controller 110. The control signals include the first, second, and third clock signals SCLK1, SCLK2, and SCLK3, the first control signal CLK1, the inverted first control signal CLK1B, the second control signal CLK2, the inverted second control signal CLK2B, the scan start signal SSP, the first mode signal PI, the second mode signal EN1, and the third mode signal EN2.

The scan driver 140 supplies scan signals to the scan lines S[1], S[2], ..., S[2n] according to the control signals generated by the signal generator 130. When the scan driver 140 operates in the progressive scanning mode, scan signals are sequentially applied to the scan lines S[1], S[2], ..., S[2n] and data signals are applied to the pixel circuits 121 in synchronization with the scan signals. When the scan driver 140 operates in the interlaced scanning mode, scan signals are sequentially applied to odd-numbered scan lines S[1], S[3], ..., S[2n-1]. When the scanning operation performed on the odd-numbered scan lines S[1], S[3], ..., S[2n-1] is ended, a scanning operation on even-numbered scan lines S[2], S[4], ..., S[2n] is started to sequentially apply scan signals to the even-numbered scan lines S[2], S[4], ..., S[2n].

The scan driver 140 may operate according to the circuits and timing diagrams shown in FIGS. 1 through 13 and detailed explanation thereof is not provided again.

The data driver 150 applies data signals to the data lines D[1], D[2], ..., D[m]. The data signals may be output from a voltage source or a current source included in the data driver 150.

According to the above-described configuration, the flat panel display device including a scan driver that can selectively perform progressive scan and interlaced scan by varying the mode signals applied to the plurality of stages included in the scan driver is provided.

According to embodiments of the present invention, a single scan driver can be used for progressive scan and interlaced scan because an additional scan driver according to a scan method is not required.

A program for executing a method of driving the pixel circuits according to the embodiments and modified examples can be stored in a recording medium. The recording medium includes a storage medium such as a magnetic storage medium (for example, ROM, floppy disk, and hard disk) and an optical reading medium (for example, CD-ROM and DVD).

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A scan driver comprising:
   a shift register comprising a plurality of stages, each of the plurality of stages comprising:
      a signal shift unit comprising a first output terminal, the signal shift unit being coupled to a control signal line configured to transmit a control signal, an inverted control signal line configured to transmit an inverted control signal, and either a scan start signal line or the first output terminal of a previous one of the stages, and being configured to output voltages through the first output terminal and a second output terminal thereof;
      an odd-numbered scan unit coupled to the first output terminal and the second output terminal of the signal shift unit, and configured to apply a scan signal to an odd-numbered scan line according to a plurality of mode signals and one of a plurality of clock signals, the clock signals being distinct from the control signal and the inverted control signal; and
      an even-numbered scan unit coupled to the first output terminal and the second output terminal of the signal shift unit, and configured to apply a scan signal to an even-numbered scan line according to the plurality of mode signals and another one of the plurality of clock signals.

2. The scan driver of claim 1, wherein the signal shift unit comprises:
   a first transistor coupled between a first power supply line and a first node, and having a gate coupled to the control signal line;
   a second transistor coupled between the first node and the inverted control signal line, and having a gate coupled to a second node;
   a third transistor coupled between the second node and either the scan start signal line or the first output terminal of the previous one of the stages, and having a gate coupled to the control signal line;
   a fourth transistor coupled between the first power supply line and a third node, and having a gate coupled to the first node;
   a fifth transistor coupled between the third node and a second power supply line, and having a gate coupled to the control signal line;
   a sixth transistor coupled between the first power supply line and the first output terminal, and having a gate coupled to the third node;
   a seventh transistor coupled between the first output terminal and the second power supply line, and having a gate coupled to the first node;
   an eighth transistor coupled between the first power supply line and the second output terminal, and having a gate coupled to the first output terminal; and
   a ninth transistor coupled between the second output terminal and the second power supply line, and having a gate coupled to the third node.

3. The scan driver of claim 2, wherein the signal shift unit further comprises:
   a first capacitor coupled between the first node and the second node; and
   a second capacitor coupled between the third node and the second output terminal.

4. The scan driver of claim 1, wherein the plurality of clock signals comprise 3-phase clock signals.

5. The scan driver of claim 4, wherein the one of the plurality of clock signals applied to the odd-numbered scan unit has a phase different from that of the other one of the signals applied to the even-numbered scan unit.

6. The scan driver of claim 1, wherein the control signal line comprises a first control signal line and a second control signal line, the inverted control signal line comprises an inverted first control signal line and an inverted second control signal line, the signal shift unit included in an odd-numbered one of the stages is coupled to the first control signal line and the inverted first control signal line, and the signal shift unit included in an even-numbered one of the stages is coupled to the second control signal line and the inverted second control signal line.

7. The scan driver of claim 1, wherein the control signal and the inverted control signal have a period that is substantially four times a period of each of the plurality of clock signals.

8. The scan driver of claim 1, wherein the control signal and the inverted control signal have a period that is substantially twice a period of each of the plurality of clock signals during an interlaced scanning operation.

9. A scan driver comprising a shift register having a plurality of stages, each of the plurality of stages comprising:
 a signal shift unit comprising a first output terminal and being coupled to a control signal line, an inverted control signal line, and either a scan start signal line or the first output terminal of a previous one of the stages, the signal shift unit being configured to output voltages through the first output terminal and a second output terminal thereof;
 an odd-numbered scan unit coupled to the first output terminal and the second output terminal of the signal shift unit, and configured to apply a scan signal to an odd-numbered scan line according to a plurality of mode signals and one of a plurality of clock signals; and
 an even-numbered scan unit coupled to the first output terminal and the second output terminal of the signal shift unit, and configured to apply a scan signal to an even-numbered scan line according to the plurality of mode signals and another one of the plurality of clock signals,
 wherein the signal shift unit comprises:
  a first transistor coupled between a first power supply line and a first node, and having a gate coupled to the control signal line;
  a second transistor coupled between the first node and the inverted control signal line, and having a gate coupled to a second node;
  a third transistor coupled between the second node and either the scan start signal line or the first output terminal of the previous one of the stages, and having a gate coupled to the control signal line;
  a fourth transistor coupled between the first power supply line and a third node, and having a gate coupled to the first node;
  a fifth transistor coupled between the third node and a second power supply line, and having a gate coupled to the control signal line;
  a sixth transistor coupled between the first power supply line and the first output terminal, and having a gate coupled to the third node;
  a seventh transistor coupled between the first output terminal and the second power supply line, and having a gate coupled to the first node;
  an eighth transistor coupled between the first power supply line and the second output terminal, and having a gate coupled to the first output terminal; and
  a ninth transistor coupled between the second output terminal and the second power supply line, and having a gate coupled to the third node, and
 wherein the plurality of mode signals comprises a first mode signal, a second mode signal, and a third mode signal, and the odd-numbered scan unit comprises:
  a tenth transistor coupled between the first output terminal of the signal shift unit and a seventh node, and having a gate configured to receive the second mode signal;
  an eleventh transistor coupled between the first power supply line and a sixth node, and having a gate configured to receive the first mode signal;
  a twelfth transistor coupled between the sixth node and the seventh node, and having a gate configured to receive the third mode signal;
  a thirteenth transistor coupled between a first clock signal line configured to receive the one of the plurality of clock signals, and an output terminal of the odd-numbered scan unit, and having a gate coupled to the seventh node;
  a third capacitor coupled between the seventh node and the output terminal of the odd-numbered scan unit; and
  a fourteenth transistor coupled between the output terminal of the odd-numbered scan unit and the first power supply line, and having a gate coupled to the second output terminal of the signal shift unit.

10. The scan driver of claim 9, wherein the even-numbered scan unit comprises:
 a fifteenth transistor coupled between the first output terminal of the signal shift unit and a ninth node, and having a gate configured to receive the third mode signal;
 a sixteenth transistor coupled between the first power supply line and an eighth node, and having a gate configured to receive the first mode signal;
 a seventeenth transistor coupled between the eighth node and the ninth node, and having a gate configured to receive the second mode signal;
 an eighteenth transistor coupled between a second clock signal line configured to receive the other one of the plurality of clock signals, and an output terminal of the even-numbered scan unit, and having a gate coupled to the ninth node;
 a fourth capacitor coupled between the ninth node and the output terminal of the even-numbered scan unit; and
 a nineteenth transistor coupled between the output terminal of the even-numbered scan unit and the first power supply line, and having a gate coupled to the second output terminal of the signal shift unit.

11. The scan driver of claim 9, wherein a voltage level of the first power supply line is higher than a voltage level of the second power supply line.

12. The scan driver of claim 11, wherein the first through fourteenth transistors are PMOS transistors.

13. The scan driver of claim 12, wherein the first mode signal has a high level, and the second and third mode signals have a low level lower than the high level during a progressive scanning operation.

14. The scan driver of claim 12, wherein the first and second mode signals have a low level, and the third mode signal has a high level higher than the low level during an interlaced scanning operation performed on odd-numbered scan lines.

15. The scan driver of claim 12, wherein the first and third mode signals have a low level, and the second mode signal has a high level higher than the low level during an interlaced scanning operation performed on even-numbered scan lines.

16. The scan driver of claim 9, wherein a voltage level of the second power supply line is higher than a voltage level of the first power supply line.

17. The scan driver of claim 16, wherein the first through fourteenth transistors are NMOS transistors.

18. The scan driver of claim 16, wherein the first mode signal has a low level, and the second and third mode signals have a high level higher than the low level during a progressive scanning operation.

19. The scan driver of claim 16, wherein the first and second mode signals have a high level, and the third mode signal has a low level lower than the high level during an interlaced scanning operation performed on odd-numbered scan lines.

20. The scan driver of claim 16, wherein the first and third mode signals have a high level, and the second mode signal has a low level lower than the high level during an interlaced scanning operation performed on even-numbered scan lines.

21. A scan driver comprising a shift register having a plurality of stages, each of the plurality of stages comprising:
  a signal shift unit comprising a first output terminal and being coupled to a control signal line, an inverted control signal line, and either a scan start signal line or the first output terminal of a previous one of the stages, the signal shift unit being configured to output voltages through the first output terminal and a second output terminal thereof;
  an odd-numbered scan unit coupled to the first output terminal and the second output terminal of the signal shift unit, and configured to apply a scan signal to an odd-numbered scan line according to a plurality of mode signals and one of a plurality of clock signals; and
  an even-numbered scan unit coupled to the first output terminal and the second output terminal of the signal shift unit, and configured to apply a scan signal to an even-numbered scan line according to the plurality of mode signals and another one of the plurality of clock signals,
  wherein the signal shift unit comprises:
    a first transistor coupled between a first power supply line and a first node, and having a gate coupled to the control signal line;
    a second transistor coupled between the first node and the inverted control signal line, and having a gate coupled to a second node;
    a third transistor coupled between the second node and either the scan start signal line or the first output terminal of the previous one of the stages, and having a gate coupled to the control signal line;
    a fourth transistor coupled between the first power supply line and a third node, and having a gate coupled to the first node;
    a fifth transistor coupled between the third node and a second power supply line, and having a gate coupled to the control signal line;
    a sixth transistor coupled between the first power supply line and the first output terminal, and having a gate coupled to the third node;
    a seventh transistor coupled between the first output terminal and the second power supply line, and having a gate coupled to the first node;
    an eighth transistor coupled between the first power supply line and the second output terminal, and having a gate coupled to the first output terminal; and
    a ninth transistor coupled between the second output terminal and the second power supply line and having a gate coupled to the third node,
  wherein the plurality of mode signals comprises a first mode signal, a second mode signal, and a third mode signal, and
  wherein the even-numbered scan unit comprises:
    a tenth transistor coupled between the first output terminal of the signal shift unit and a fifth node, and having a gate configured to receive the third mode signal;
    an eleventh transistor coupled between the first power supply line and a fourth node, and having a gate configured to receive the first mode signal;
    a twelfth transistor coupled between the eighth fourth node and the fifth node, and having a gate configured to receive the second mode signal;
    a thirteenth transistor coupled between a second clock signal line configured to receive the other one of the plurality of clock signals, and an output terminal of the even-numbered scan unit, and having a gate coupled to the fifth node;
    a first capacitor coupled between the fifth node and the output terminal of the even-numbered scan unit; and
    a fourteenth transistor coupled between the output terminal of the even-numbered scan unit and the first power supply line, and having a gate coupled to the second output terminal of the signal shift unit.

* * * * *